(12) United States Patent
Chang

(10) Patent No.: US 12,211,765 B2
(45) Date of Patent: *Jan. 28, 2025

(54) SEMICONDUCTOR DEVICE PACKAGE

(71) Applicant: Advanced Semiconductor Engineering, Inc., Kaohsiung (TW)

(72) Inventor: Wei-Tung Chang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/212,160

(22) Filed: Jun. 20, 2023

(65) Prior Publication Data

US 2023/0335454 A1 Oct. 19, 2023

Related U.S. Application Data

(63) Continuation of application No. 17/239,478, filed on Apr. 23, 2021, now Pat. No. 11,682,601.

(51) Int. Cl.
*H01L 23/31* (2006.01)
*H01L 21/56* (2006.01)
*H01L 23/66* (2006.01)

(52) U.S. Cl.
CPC .......... *H01L 23/3157* (2013.01); *H01L 21/56* (2013.01); *H01L 23/66* (2013.01); *H01L 2223/6616* (2013.01); *H01L 2223/6677* (2013.01)

(58) Field of Classification Search
CPC ...... H01L 23/3157; H01L 23/66; H01L 21/56
USPC ........................................... 257/728
See application file for complete search history.

(56) References Cited

U.S. PATENT DOCUMENTS

| 11,682,601 B2 * | 6/2023 | Chang ................... H01L 21/56 257/728 |
| 2014/0138804 A1 | 5/2014 | Takizawa et al. |
| 2018/0226366 A1 * | 8/2018 | Kim .................... H01L 25/0655 |

OTHER PUBLICATIONS

Non-Final Office Action for U.S. Appl. No. 17/239,478, issued Oct. 19, 2022, 8 pages.
Notice of Allowance for U.S. Appl. No. 17/239,478, issued Feb. 6, 2023, 7 pages.

* cited by examiner

*Primary Examiner* — Quoc D Hoang
(74) *Attorney, Agent, or Firm* — FOLEY & LARDNER LLP

(57) ABSTRACT

The present disclosure provides a semiconductor device package including a first device, a second device, and a spacer. The first device includes a substrate having a first dielectric constant. The second device includes a dielectric element, an antenna, and a reinforcing element. The dielectric element has a second dielectric constant less than the first dielectric constant. The antenna is at least partially within the dielectric element. The reinforcing element is disposed on the dielectric element, and the reinforcing element has a third dielectric constant greater than the first dielectric constant. The spacer is disposed between the first device and the second device and configured to define a distance between the first device and the second device.

19 Claims, 26 Drawing Sheets

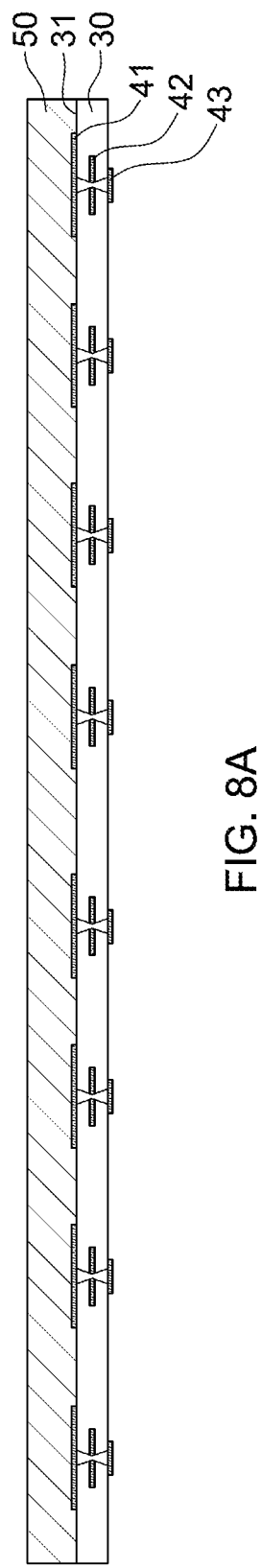
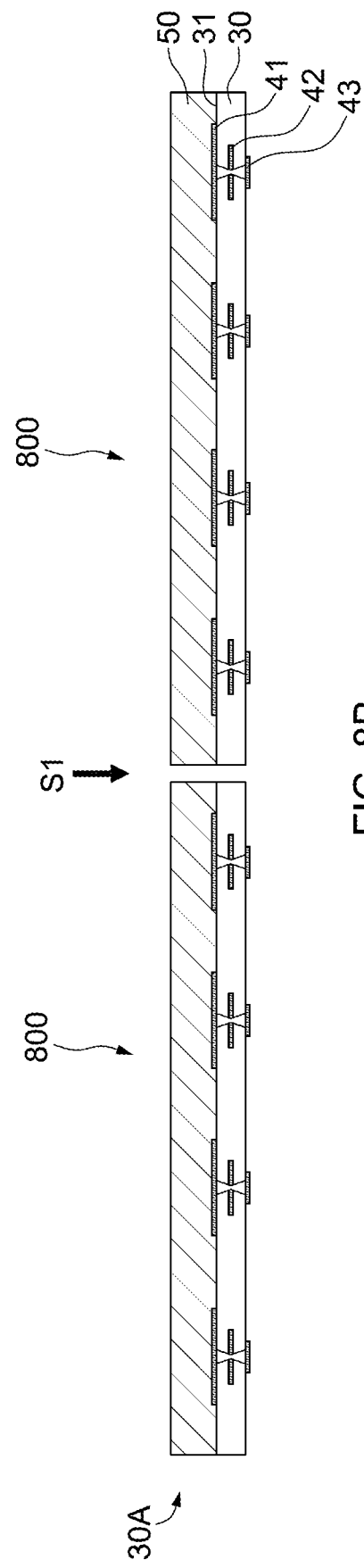

SEMICONDUCTOR DEVICE PACKAGE

CROSS REFERENCE TO RELATED APPLICATION

This application is a continuation of U.S. patent application Ser. No. 17/239,478, filed Apr. 23, 2021, which is incorporated herein by reference in its entirety.

BACKGROUND

1. Technical Field

The present disclosure generally relates to a semiconductor device package, and particularly to a semiconductor device package including a protection layer.

2. Description of the Related Art

Wireless communication devices, such as cell phones, typically include antennas for transmitting and receiving radio frequency (RF) signals. A wireless communication device package normally includes an antenna substrate and a communication substrate. The antenna substrate and the communication substrate are heterogeneous substrates having different requirements. For example, the antenna substrate requires a desired peak gain of the antenna thereof and a thinner thickness of the antenna substrate. Therefore, it is desirable to integrate the heterogeneous substrates without affecting the performance of the antenna as well as the entire device package.

SUMMARY

In one or more embodiments, a semiconductor device package includes a first device, a second device, and a spacer. The first device includes a substrate having a first dielectric constant. The second device includes a dielectric element, an antenna, and a reinforcing element. The dielectric element has a second dielectric constant less than the first dielectric constant. The antenna is at least partially within the dielectric element. The reinforcing element is disposed on the dielectric element, and the reinforcing element has a third dielectric constant greater than the first dielectric constant. The spacer is disposed between the first device and the second device and configured to define a distance between the first device and the second device.

In one or more embodiments, a semiconductor device package includes a substrate, a radiating element, and a reinforcing element. The substrate has a first surface and a second surface opposite to the first surface. The radiating element is disposed on the first surface of the substrate and configured to radiate an electromagnetic wave. The reinforcing element is connected to the radiating element and is configured to enlarge a bandwidth of the electromagnetic wave In one or more embodiments, a method of manufacturing a semiconductor device package includes: providing a first device comprising a substrate, the substrate having a first dielectric constant; providing a second device, the second device including: a dielectric element having a second dielectric constant less than the first dielectric constant; an antenna at least partially within the dielectric element; and a reinforcing element disposed on the dielectric element, the reinforcing element having a third dielectric constant greater than the first dielectric constant; and bonding the second device to the first device by connecting the dielectric element to the substrate.

BRIEF DESCRIPTION OF THE DRAWINGS

Aspects of the present disclosure are readily understood from the following detailed description when read with the accompanying figures. It should be noted that various features may not be drawn to scale. The dimensions of the various features may be arbitrarily increased or reduced for clarity of discussion.

FIG. 8A, FIG. 8B, FIG. 8C, FIG.8D, FIG. 8E, FIG. 8F, and FIG. 8G illustrate one or more stages of a method of manufacturing a semiconductor device package in accordance with some embodiments of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
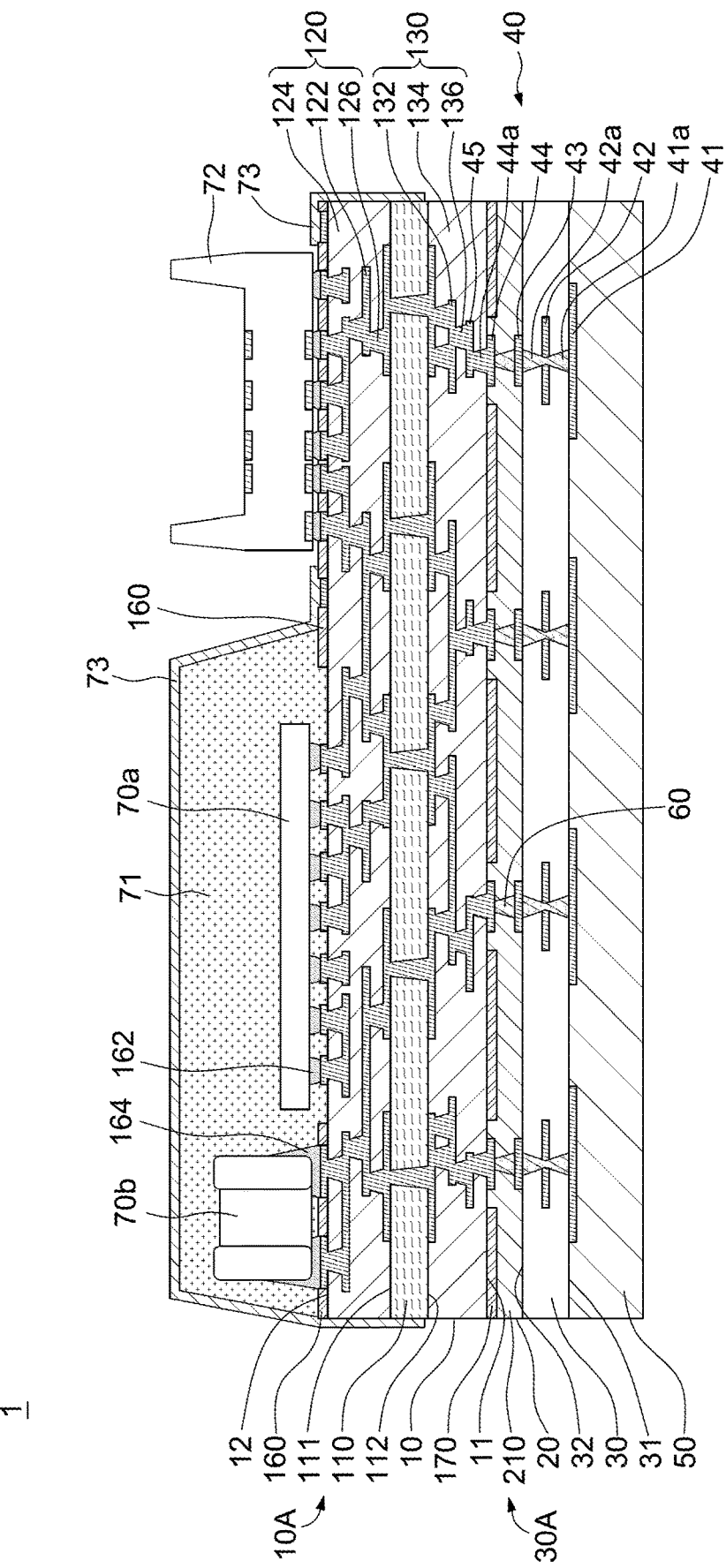
FIG. 1 illustrates a cross-sectional view of a semiconductor device package, in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. Besides, the present disclosure may repeat reference numerals and/or letters in the various examples. This repetition is for simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1 illustrates a cross-sectional view of a semiconductor device package 1, in accordance with some embodiments of the present disclosure. The semiconductor device package 1 includes devices 10A and 30A, spacers, electronic components 70a, 70b package body 71, a connector 72, and a shielding layer 73. The device 10A may include a substrate 10. The device 30A may include a dielectric layer 30 (also referred to as "a dielectric element"), an antenna 40, and a protection layer 50 (also referred to as "a reinforcing element"). The spacer may include a connection element 20 (also referred to as "a film") and a conductive element 60.

The substrate 10 may be, for example, a printed circuit board, such as a paper-based copper foil laminate, a composite copper foil laminate, or a polymer-impregnated glass-fiber-based copper foil laminate. The substrate 10 may include an interconnection structure, such as a redistribution layer (RDL) or a grounding element. The substrate 10 may be a single-layer substrate or a multi-layer substrate. In some embodiments, a dielectric constant of the substrate 10 is greater than 3. In some embodiments, a dielectric constant of the substrate 10 is about 4. In some embodiments, the dielectric constant of the substrate 10 is from about 3 to about 5. The substrate 10 may have a surface 11 and a surface 12 opposite to the surface 11. In some embodiments, an insulating layer 160 such as a solder mask or the like may be disposed on the surface 12 of the substrate 10. In some embodiments, an insulating layer 170 such as a solder mask or the like may be disposed on the surface 12 of the substrate 10.

In some embodiments, the substrate 10 includes a core layer 110 and circuit layers 120 and 130. In some embodiments, the circuit layer 120 is disposed on a surface 111 of the core layer 110, and the circuit layer 130 is disposed on a surface 112 of the core layer 110. In some embodiments, the circuit layer 120 includes one or more conductive layers 122 and a dielectric layer 124, and the circuit layer 130 includes one or more conductive layers 132 and a dielectric layer 134. In some other embodiments, the substrate 10 may include a core-less substrate, and the core layer 110 can be omitted.

The conductive layers 122 and 132 may be configured as redistribution layers (RDLs), and electrically connected to the antenna 40. In some embodiments, the conductive layers 122 may be electrically connected through conductive vias 126. In some embodiments, the conductive layers 132 may be electrically connected through conductive vias 136. The material of each of the conductive layers 122 and 132 and the conductive vias 126 and 136 may individually include metal such as copper or other suitable conductive material.

In some embodiments, the material of each of the dielectric layers 124 and 134 may individually include an organic dielectric material such as epoxy-based material (e.g. FR4), a resin-based material (e.g. bismaleimide-triazine (BT)), polypropylene (PP)), a molding compound or other suitable materials. The dielectric layers 124 and 134 may include a transparent material, a semi-transparent material or an opaque material. In some embodiments, a dielectric constant of the dielectric layer 124 and/or the dielectric layer 134 is greater than 3. In some embodiments, a dielectric constant of the dielectric layer 124 and/or the dielectric layer 134 is about 4. In some embodiments, the dielectric constant of the dielectric layer 124 and/or the dielectric layer 134 is from about 3 to about 5.

In some embodiments, the connection element 20 (or the film) is adhered to the substrate 10. In some embodiments, the connection element 20 is disposed on the surface 11 of the substrate 10. In some embodiments, the connection element connects the dielectric element 30 to the surface 11 of the substrate 10. In some embodiments, a lateral surface of the connection element 20 substantially aligns to a lateral surface of the substrate 10. In some embodiments, the circuit layer 130 is in contact with the connection element 20. In some embodiments, the insulating layer 170 is covered by or embedded in the connection element 20. In some embodiments, a dielectric constant of the substrate 10 is higher than a dielectric constant of the connection element 20. In some embodiments, the dielectric constant of the connection element 20 is less than 3. In some embodiments, the dielectric constant of the connection element 20 is from about 1 to about 3.

In some embodiments, the connection element 20 includes an adhesive layer 210 connecting the substrate 10 to the dielectric layer 30. In some embodiments, the connection element 20 includes a liquid crystal polymer (LCP), polytetrafluoroethylene (PTFE), poly(phenylene ethynylene) (PPE), or a combination thereof.

In some embodiments, the dielectric layer 30 is disposed on the connection element 20. In some embodiments, an area of the dielectric layer 30 is substantially equivalent to an area of the substrate 10. In some other embodiments, an area of the dielectric layer 30 is less than an area of the substrate 10 (not shown in FIG. 1). In some embodiments, the dielectric constant of the substrate 10 is higher than a dielectric constant of the dielectric layer 30. In some embodiments, the dielectric constant of the dielectric layer 30 is less than 3. In some embodiments, the dielectric constant of the dielectric layer 30 is from about 1 to about 3. In some embodiments, the dielectric layer comprises a LCP, PTFE, PPE, polyimide (PI), modified-polyimide (MPI), or a combination thereof. In some embodiments, the connection element 20 and the dielectric layer 30 include different materials. In other embodiments, the connection element 20 and the dielectric layer 30 include a same material.

In some embodiments, the semiconductor device package 1 may include a plurality of conductive layers (e.g., conductive layers 44 and 45) disposed on, adjacent to, embedded in, and/or exposed by the dielectric layer 134 of the circuit layer 130 of the substrate 10. In some embodiments, the conductive layers 44 and 45 are electrically connected through a conductive via 44a. In some embodiments, the semiconductor device package 1 may include a plurality of conductive layers (e.g., conductive layers 41, 42, and 43) disposed on, adjacent to, embedded in, and/or exposed by the dielectric layer 30. In some embodiments, the conductive layers 43 and 42 are electrically connected through a conductive via 42a. In some embodiments, the conductive layers 42 and 41 are electrically connected through a conductive via 41a. In some embodiments, the conductive via 41a directly contacts the conductive via 42a and in combined form an X-shaped via.

In some embodiments, the antenna 40 may include one or more conductive layers or antenna patterns (e.g., the conductive layers 41, 42, 43, 44, 45), and the conductive element 60 electrically connects the substrate 10 with the antenna 40. In some embodiments, the conductive element 60 electrically connects the conductive layer 44 with the conductive layer 43. In some embodiments, the conductive element 60 may include one or more conductive vias, one or more conductive balls, or a combination thereof. In some embodiments, the conductive element 60 illustrated in FIG. 1 includes conductive vias. In some embodiments, the material of the conductive element 60 may include a solder material such as tin (Sn), lead (Pb), silver (Ag), copper (Cu), or an alloy thereof. In some other embodiments, the material of the conductive element 60 may include metal such as copper, silver or other suitable conductive material. In some embodiments, the conductive elements 60 serving as spacers are spaced apart from each other.

In some embodiments, a size of a conductive via within an antenna substrate (e.g., a substrate structure including the antenna 40) is less than a size of a conductive via within a communication substrate (i.e., the substrate 10). In some embodiments, a size of a conductive via within an antenna substrate (e.g., a substrate structure including the antenna 40) is less than a size of a conductive via connecting the antenna substrate to a communication substrate (i.e., the substrate 10).

In some embodiments, the antenna 40 may be at least partially within the dielectric layer 30. In some embodiments, the antenna 40 may include conductive layers 41, 42, and 43 (or antenna patterns), for example, the conductive layer 41 may function as a director, and the conductive layers 42 and 43 may function as a radiator. In other embodiments, the conductive layer 41 may also function as a radiator. In some embodiments, a size of the conductive element 60 (or conductive via) is greater than a size of the conductive via 41*a* and a size of the conductive via 42*a*. In some embodiments, the structure including the dielectric layer 30, the conductive layers 41, 42, and 43, and the conductive vias 41*a* and 42*a* may be referred to as an antenna substrate.

In some embodiments, the antenna 40 may include conductive layers 41, 42, 43, and 44 (or antenna patterns), for example, the conductive layer 41 may function as a director, and the conductive layers 42-44 may function as a radiator. In some embodiments, a size of the conductive via 44*a* is greater than a size of the conductive element 60 (or conductive via), a size of the conductive via 41*a*, and a size of the conductive via 42*a*. In some embodiments, the structure including the connection element 20, the dielectric layer 30, the conductive layers 41, 42, 43, 44, and the conductive vias 41*a*, 42*a*, and 60 may be referred to as an antenna substrate.

In some embodiments, the antenna 40 may include conductive layers 41, 42, 43, 44, and 45 (or antenna patterns), for example, the conductive layer 41 may function as a director, and the conductive layers 42-45 may function as a radiator. In some embodiments, a size of the conductive via 136 is greater than a size of the conductive via 44*a*, a size of the conductive element 60 (or conductive via), a size of the conductive via 41*a*, and a size of the conductive via 42*a*. In some embodiments, the structure including a portion of the dielectric layer 134 of the substrate 10, the connection element 20, the dielectric layer 30, the conductive layers 41, 42, 43, 44, 45, and the conductive vias 41*a*, 42*a*, 60, and 44*a* may be referred to as an antenna substrate.

In some embodiments, a conductive pad or a bonding pad (e.g., the conductive layer 44) may be disposed on the surface 11 of the substrate 10 and electrically connected to the circuit layer 130, and a conductive pad or a bonding pad (e.g., the conductive layer 43) may be disposed on a surface 32 of the dielectric layer 30 and electrically connected to the antenna (e.g., the antenna patterns or conductive layers 41 and 42). In some embodiments, the conductive pad (or the conductive layer 43) is electrically connected to the conductive pad (or the conductive layer 42) through the conductive element 60 (or conductive via).

In some embodiments, at least a portion of the antenna 40 (e.g., the conductive layer 41) is disposed on a surface 31 of the dielectric layer 30 facing away from the connection element 20. In some embodiments, the portion of the antenna 40 (e.g., the conductive layer 41) is covered by the protection layer 50.

In some embodiments, a radiating layer (also referred to as "a radiating element") may be disposed on the surface 11 of the substrate 10 and configured to radiate an electromagnetic wave. In some embodiments, the radiating layer may be defined by or include the connection element 20 and the dielectric layer 30. In some embodiments, the radiating layer may be defined by or include the connection element 20, the dielectric layer 30, and a portion of the substrate 10 proximal to the connection element 20. In some embodiments, the radiating layer may include a circuit including the dielectric layer and an antenna pattern (e.g., the conductive layer 41) connected to the dielectric layer 30. In some embodiments, the antenna pattern (e.g., the conductive layer 41) of the radiating layer is embedded in the protection layer 50 (or the reinforcing element). In some embodiments the substrate 10 may include an antenna pattern (e.g., the conductive layers 44 and 45) coupled to the antenna pattern (e.g., the conductive layer 41) of the radiating layer. In some embodiments, the radiating layer may include an aforesaid antenna substrate.

In some embodiments, the protection layer 50 is disposed on the dielectric layer 30. In some embodiments, the protection layer 50 covers the radiating layer and configured to enlarge a bandwidth of the electromagnetic wave radiated by the antenna 40. In some embodiments, the protection layer 50 covers the antenna 40. In some embodiments, the protection layer 50 covers the conductive layer 41 of the antenna 40. In some embodiments, the protection layer 50 includes a molding compound material.

In some embodiments, a dielectric constant of the protection layer 50 is higher than the dielectric constant of the substrate 10. In some embodiments, the dielectric constant of the protection layer 50 is greater than 4. In some embodiments, the dielectric constant of the protection layer 50 is from about 4 to about 20.

In some embodiments, the protection layer 50 has a rigidity greater than a rigidity of the connection element 20. In some embodiments, the rigidity of the protection layer 50 is greater than a rigidity of the dielectric layer 30. In some embodiments, the rigidity of the protection layer 50 is higher than a rigidity of the radiating layer.

In some embodiments, a modulus of the protection layer 50 is greater than a modulus of the connection element 20. In some embodiments, the modulus of the protection layer 50 is greater than a modulus of the dielectric layer 30. In some embodiments, the modulus of the protection layer 50 is greater than both the modulus of the connection element 20 and the modulus of the dielectric layer 30. For example, the Young's modulus of the connection element 20 may be from about 0.1 GPa to about 1 GPa, the Young's modulus of the dielectric layer 30 may be from about 0.1 GPa to about 10 GPa, and the Young's modulus of the protection layer 50 may be from about 15 GPa to about 400 GPa.

In some embodiments, a coefficient of thermal expansion (CTE) of the protection layer 50 is lower than a CTE of the connection element 20. In some embodiments, the CTE of the protection layer 50 is lower than a CTE of the dielectric layer 30. For example, the CTE of the connection element 20 may be from about $100\times10^{-6}$/K to about $200\times10^{-6}$/K, the Young's modulus of the dielectric layer 30 may be from about $10\times10^{-6}$/K to about $30\times10^{-6}$/K, and the Young's modulus of the protection layer 50 may be from about $1\times10^{-6}$/K to about $15\times10^{-6}$/K.

In some embodiments, the electronic components 70a and 70b are disposed on the surface 12 of the substrate 10. In some embodiments, the electronic components 70a and 70b are electrically connected to the circuit layer 120. In some embodiments, the electronic components 70a and 70b are electrically connected to the antenna 40. In some embodiments, the electronic components 70a and 70b are disposed on the surface 12 of the substrate 10 and electrically connected to the radiating layer. The electrical component 70a may be an active component, such as an integrated circuit (IC) chip or a die, for example, a radio frequency IC (RFIC). The electrical component 70b may be a passive electrical component, such as a capacitor, a resistor or an inductor. The electronic components 70a and 70b each may include a surface mount device (SMD) electrically connected to the circuit layer 120 by flip-chip (FC) bonding through some conductive structures 162 and 164 such as conductive adhesives, conductive pads, conductive bumps, UBMs (under bump metallurgies) or the like.

In some embodiments, the connector 72 (or a socket) can provide electrical connections between the semiconductor device package 1 and other circuits or circuit boards. In some embodiments, the connector 72 is disposed on the surface 12 of the substrate 10 and electrically connected to the electronic components 70a and 70b. Each of the electronic components 70a and 70b and the connector 72 may be electrically connected to one or more of another one of the electronic components 70a and 70b and the connector 72 and to the substrate 10 (e.g., to the circuit layer 120), and electrical connection may be attained by way of flip-chip or wire-bond techniques.

In some embodiments, the package body 71 is disposed on the surface 12 of the substrate 10 and covering the electronic components 70a and 70b. In some embodiments, the package body 71 is disposed on a portion of the surface 12 of the substrate 10. In some embodiments, the package body 71 exposes the connector 72. In some embodiments, the package body 71 includes an epoxy resin having fillers, a molding compound (e.g., an epoxy molding compound or other molding compound), polyimide, a phenolic compound or material, a material with a silicone dispersed therein, or a combination thereof.

The shielding layer 73 is disposed on an external surface of the package body 71 and covers the package body 71, electronic components 70a and 70b, and a portion of a lateral surface the substrate 10. The shielding layer 73 may be electrically connected to a grounding element of the substrate 10. In some embodiments, the shielding layer 73 is a conformal shield. In some embodiments, the shielding layer 73 is a conductive thin film, and may include, for example, Al, Cu, Cr, Sn, Au, Ag, Ni or stainless steel, or a mixture, an alloy, or other combination thereof. The shielding layer 73 may include a single conductive layer or multiple conductive layers.

In comparative embodiments, a high-k (high-dielectric constant) and rigid substrate is used to meet the requirement of communication circuits such as a RF circuit, and a low-k (low-dielectric constant) and soft substrate is used to meet the requirement of increasing gain and thickness reduction for the antenna substrate. In addition, with the advance of integration of multiple frequency bands of electromagnetic waves as well as the needs to increase bandwidths, the number of layers of the communication circuits increases accordingly, which significantly increases manufacturing steps and the costs and lowering the yields.

According to some embodiments of the present disclosure, the connection element 20 and the dielectric layer 30 having relatively low dielectric constants (Dk) are relatively soft and thin, and thus are advantageous to increasing gain and reducing the thickness of the entire semiconductor device package. In addition to the connection element 20 and the dielectric layer 30, the protection layer 50 may add rigidity to the entire semiconductor device package so as to increase the structural strength and reduce the occurrence of warpage to the semiconductor device package.

In addition, according to some embodiments of the present disclosure, while the conductive layers included in the antenna 40 may vary according to different designs, the communication substrate may include a heterogeneous structure including the rigid substrate 10 and a soft layer (e.g., the connection element 20), which is advantageous to increasing gain and reducing the thickness of the communication substrate without changing the structural details of the communication substrate when the structure of the antenna 40 varies. Therefore, the number of layers of the substrate 10 (e.g., the communication circuit substrate) can be reduced, thereby the yields can be increased, and the costs can be reduced while a satisfactory semiconductor device package can be obtained.

Moreover, according to some embodiments of the present disclosure, the protection layer 50 having a relatively high dielectric constant and rigidity is connected to the dielectric layer 30 having a relatively low dielectric constant, and thus the frequency bands and the bandwidth of the electromagnetic waves radiated from the antenna can be both increased.

Figure 1A:
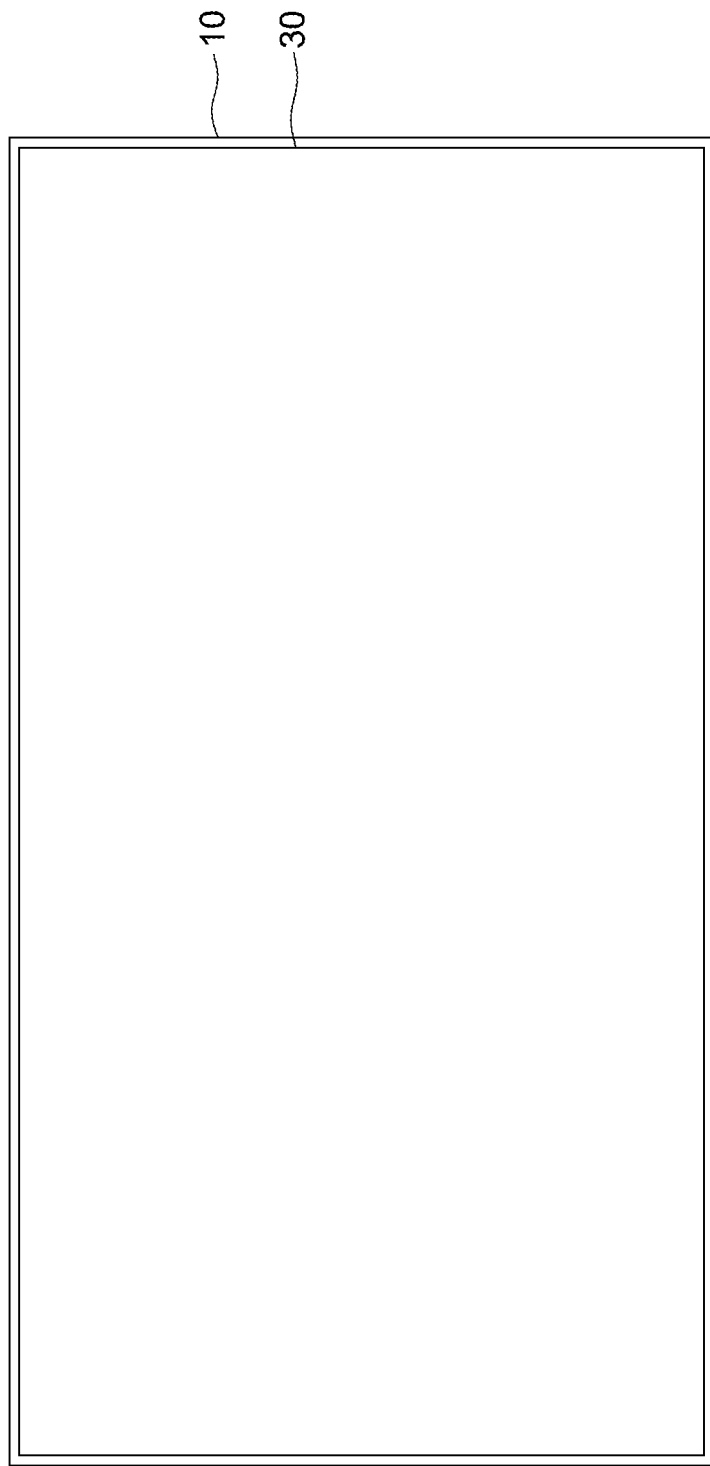
FIG. 1A illustrates a top view of a semiconductor device package, in accordance with some embodiments of the present disclosure.

FIG. 1A illustrates a top view of a semiconductor device package, in accordance with some embodiments of the present disclosure. FIG. 1A has been simplified for a better understanding of the aspects of the present disclosure. In some embodiments, a lateral surface of a portion of the dielectric element 30 is recessed from a lateral surface of the substrate 10.

Figure 2:
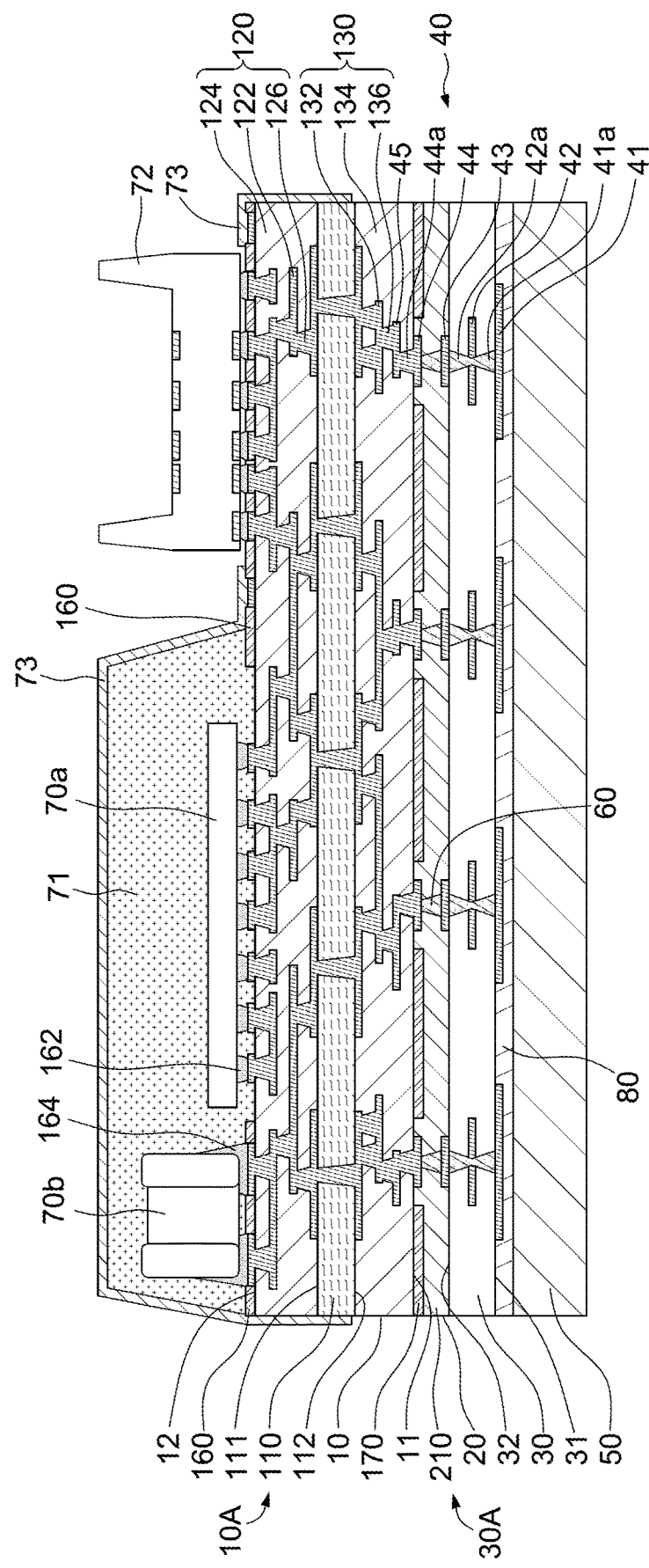
FIG. 2 illustrates a cross-sectional view of a semiconductor device package, in accordance with some embodiments of the present disclosure.

FIG. 2 illustrates a cross-sectional view of a semiconductor device package 2, in accordance with some embodiments of the present disclosure. The semiconductor device package 2 is similar to the semiconductor device package 1 in FIG. 1 except that, for example, the semiconductor device package 2 further includes an adhesive layer 80.

In some embodiments, the adhesive layer 80 is disposed on the surface 31 of the dielectric layer 30 facing away from the connection element 20. In some embodiments, the adhesive layer 80 covers the antenna 40. In some embodiments, the adhesive layer 80 covers an antenna pattern (e.g., the conductive layer 41) of the radiating layer.

In some embodiments, the protection layer 50 is in contact with the adhesive layer 80 and spaced apart from the antenna 40. In some embodiments, the protection layer 50 is in contact with the adhesive layer 80 and spaced apart from the radiating layer. In some embodiments, the protection layer 50 includes glass, ceramic, silicon, or a combination thereof.

Figure 3:
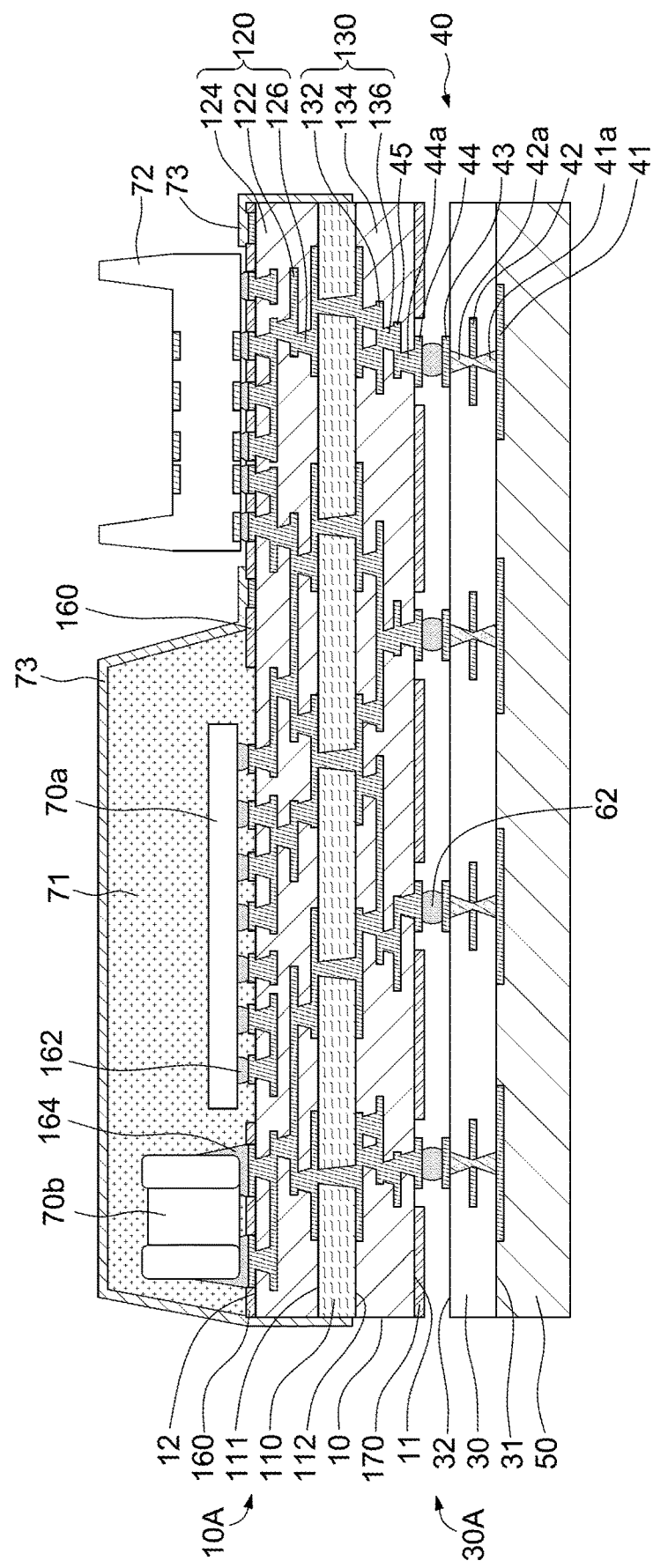
FIG. 3 illustrates a cross-sectional view of a semiconductor device package, in accordance with some embodiments of the present disclosure.

FIG. 3 illustrates a cross-sectional view of a semiconductor device package 3, in accordance with some embodiments of the present disclosure. The semiconductor device package 3 is similar to the semiconductor device package 1 in FIG. 1 except that, for example, the substrate 10 is electrically connected to the antenna 40 through conductive balls 62.

In some embodiments, the conductive balls 62 may be or include solder balls, including a controlled collapse chip connection (C4) bump, a ball grid array (BGA) or a land grid array (LGA). In some embodiments, the material of the conductive balls 62 may include a solder material such as Sn, Pb, Ag, Cu, or an alloy thereof. In some embodiments, the conductive balls 62 may be included or serve as spacers. In some embodiments, the semiconductor device package 3 may be free of the connection element 20 or the adhesive layer 210.

Figure 4:
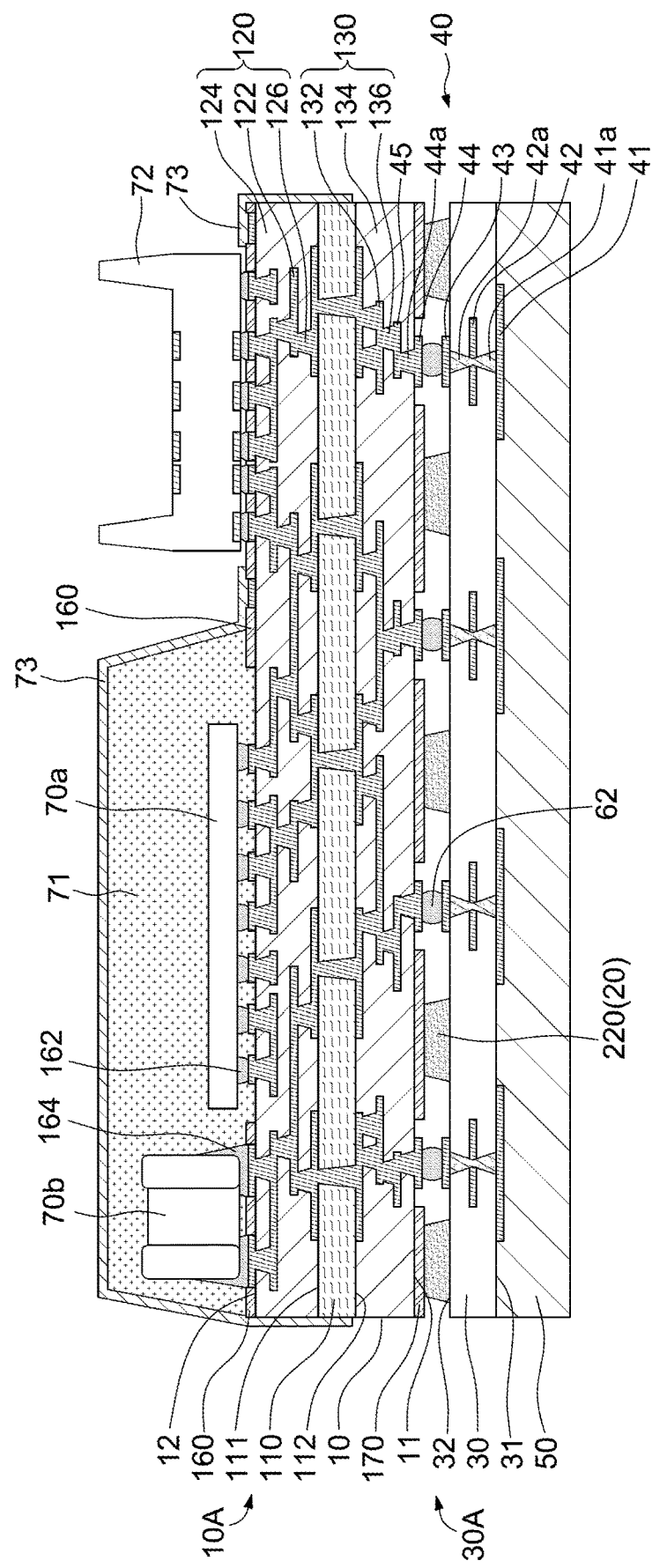
FIG. 4 illustrates a cross-sectional view of a semiconductor device package, in accordance with some embodiments of the present disclosure.

FIG. 4 illustrates a cross-sectional view of a semiconductor device package 4, in accordance with some embodiments of the present disclosure. The semiconductor device package 4 is similar to the semiconductor device package 3 in FIG. 3 except that, for example, the connection element 20 further includes a plurality of dam structures 220.

In some embodiments, the dam structures 220 are spaced apart from each other. In some embodiments, the dam structures 220 are between the conductive balls 62. In some embodiments, the dam structures 220 include a die bonding material, an underfill material, or a combination thereof. In some embodiments, the dam structures 220 may be included or serve as spacers. In some embodiments, the conductive balls 62 and the dam structures 220 serving as spacers are spaced apart from each other. In some embodiments, the conductive balls 62 and the dam structures 220 serving as spacers include different materials. In some embodiments, the conductive balls 62 and the dam structures 220 are arranged interlacedly. In some embodiments, the dam structures 220 may include a thermosetting material. In some embodiments, the cured dam structures 220 can effectively maintain the distance between the substrate 10 and the dielectric layer 30 despite that the conductive balls 62 may be melted by some operations during the manufacturing process of the semiconductor device package 4. Therefore, the distance between the substrate 10 and the antenna 40 can be fixed at a predetermined value, and thus the performance of the antenna 40 can remain satisfactory without being affected by thermal operations in the manufacturing process of the semiconductor device package 4.

Figure 5:
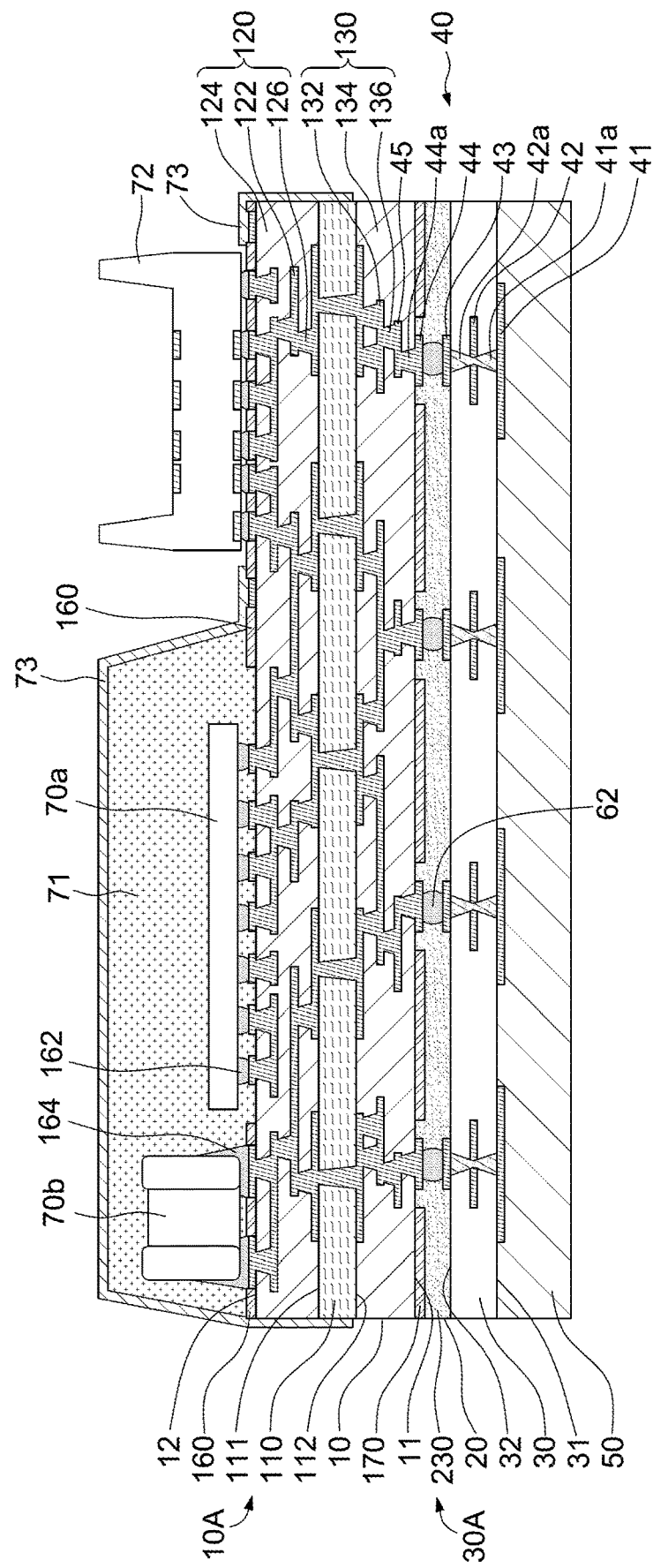
FIG. 5 illustrates a cross-sectional view of a semiconductor device package, in accordance with some embodiments of the present disclosure.

FIG. 5 illustrates a cross-sectional view of a semiconductor device package 5, in accordance with some embodiments of the present disclosure. The semiconductor device package 5 is similar to the semiconductor device package 3 in FIG. 3 except that, for example, the connection element 20 further includes a filling layer 230 (also referred to "an underfill").

In some embodiments, the filling layer 230 is between the substrate 10 and the dielectric layer 30. In some embodiments, the filling layer 230 covers the conductive balls 62. In some embodiments, the filling layer 230 encapsulates the conductive balls 62. In some embodiments, the filling layer 230 includes a molding compound, a die bonding material, a dam structure, an underfill, or a combination thereof. In some embodiments, the conductive balls 62 may be included or serve as spacers. In some embodiments, the filler layer 230 is around the conductive balls 62 (or the spacers).

Figure 6:
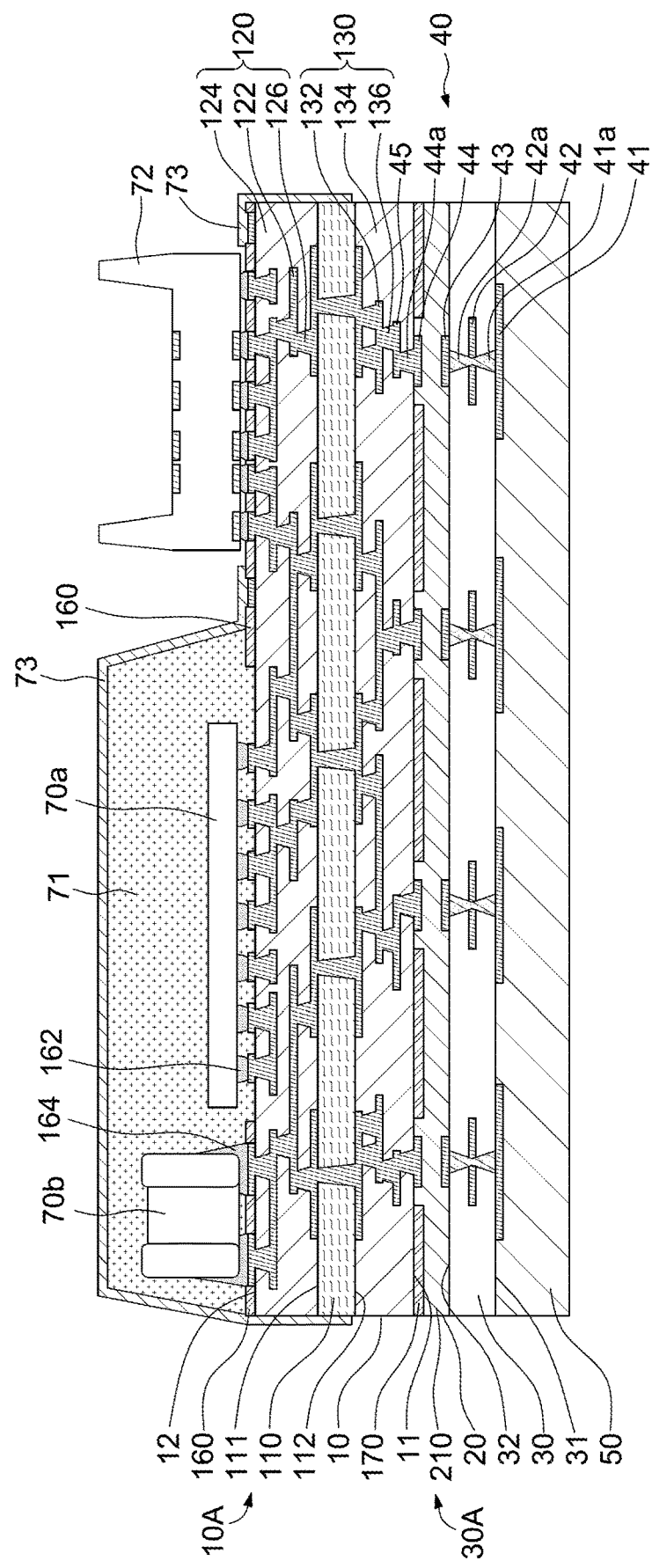
FIG. 6 illustrates a cross-sectional view of a semiconductor device package, in accordance with some embodiments of the present disclosure.

FIG. 6 illustrates a cross-sectional view of a semiconductor device package 6, in accordance with some embodiments of the present disclosure. The semiconductor device package 6 is similar to the semiconductor device package 1 in FIG. 1 except that, for example, the substrate 10 is electrically coupled to the antenna 40.

In some embodiments, the substrate 10 is physically spaced apart from the antenna 40. In some embodiments, the substrate 10 is separated from the antenna 40 by the connection element 20. In some embodiments, the semiconductor device package 6 is free of the conductive elements 60 (or conductive vias). In some embodiments, the semiconductor device package 6 is free of the conductive balls 62.

FIG. 7A, FIG. 7B, FIG. 7C, FIG.7D, FIG. 7E, and FIG. 7F illustrate one or more stages of a method of manufacturing a semiconductor device package 1 in accordance with some embodiments of the present disclosure.

Figure 7A:
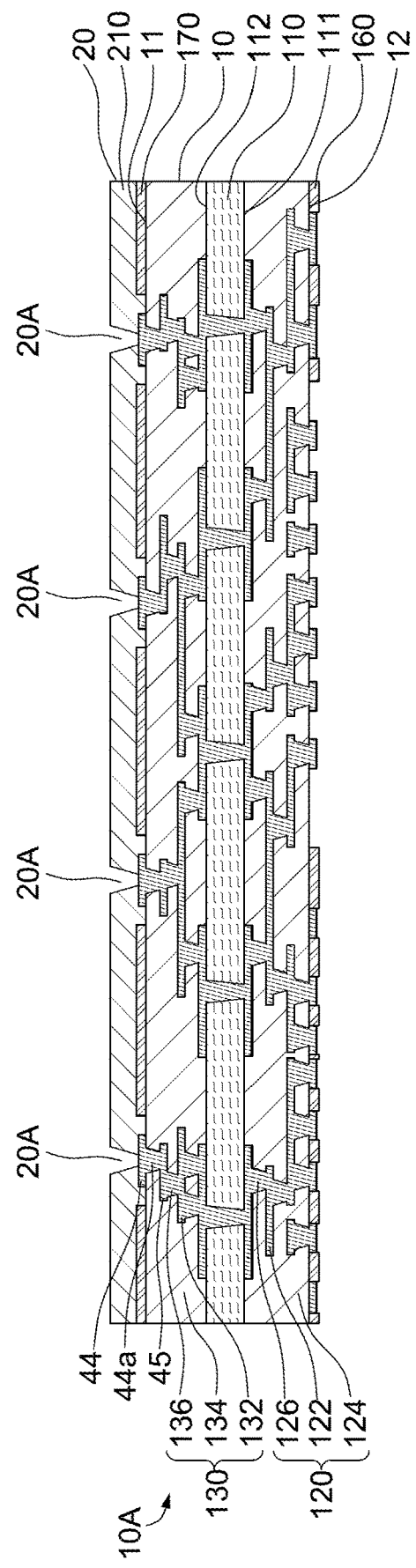
FIG. 7A, FIG. 7B, FIG. 7C, FIG.7D, FIG. 7E, and FIG. 7F illustrate one or more stages of a method of manufacturing a semiconductor device package in accordance with some embodiments of the present disclosure.

Referring to FIG. 7A, a device 10A including a substrate 10 is provided, a connection element 20 is formed on a surface 11 of the substrate 10, and openings 20A are formed within the connection element 20 to expose portions of the substrate 10. In some embodiments, the substrate 10 may be a pre-formed substrate. In some embodiments, the substrate 10 may include a core layer 110 and circuit layers 120 and 130 on two opposite surfaces 111 and 112 of the core layer 110. In some embodiments, the connection element 20 may be laminated onto the surface 11 of the substrate 10. In some embodiments, conductive pads (e.g., conductive layers 44) may be disposed on, adjacent to, embedded in, and/or exposed by the surface 11 of the substrate 10, and the openings 20A exposes the conductive pads (e.g., the conductive layers 44). In some embodiments, the openings 20A may be formed by a laser drilling operation.

Figure 7B:
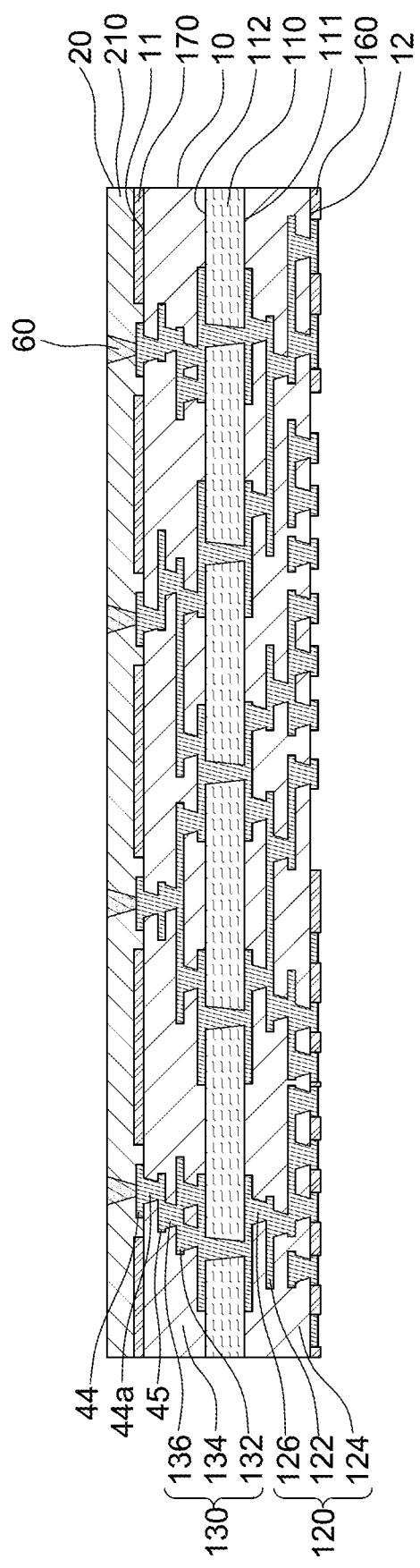

Referring to FIG. 7B, conductive elements 60 are formed in the openings 20A. In some embodiments, the conductive elements 60 formed on the conductive pads (e.g., the conductive layers 44). In some embodiments, the conductive elements 60 may be formed by coating or printing. In some embodiments, the conductive elements 60 may be formed by printing a conductive paste into the openings 20A of the connection element 20.

Figure 7C:
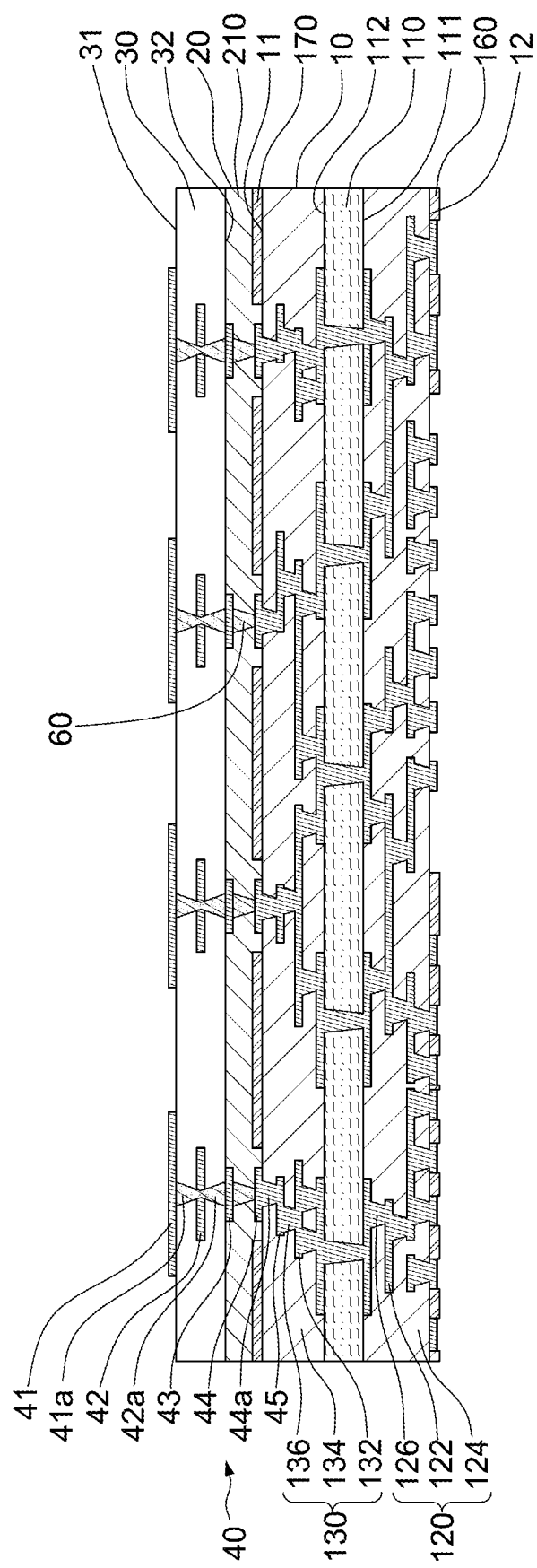

Referring to FIG. 7C, a dielectric layer 30 and conductive layers 41, 42 and 43 on or embedded in the dielectric layer 30 are disposed on the connection element 20. In some embodiments, the structure including the dielectric layer 30 and the conductive layers 41, 42, and 43 may be a pre-formed structure. In some embodiments, the aforesaid pre-formed structure may be laminated onto the connection element 20. At present, an antenna 40 including the conductive layers 41, 42, 43, and optionally the conductive layers 44 and 45 is connected to the substrate 10.

Figure 7D:
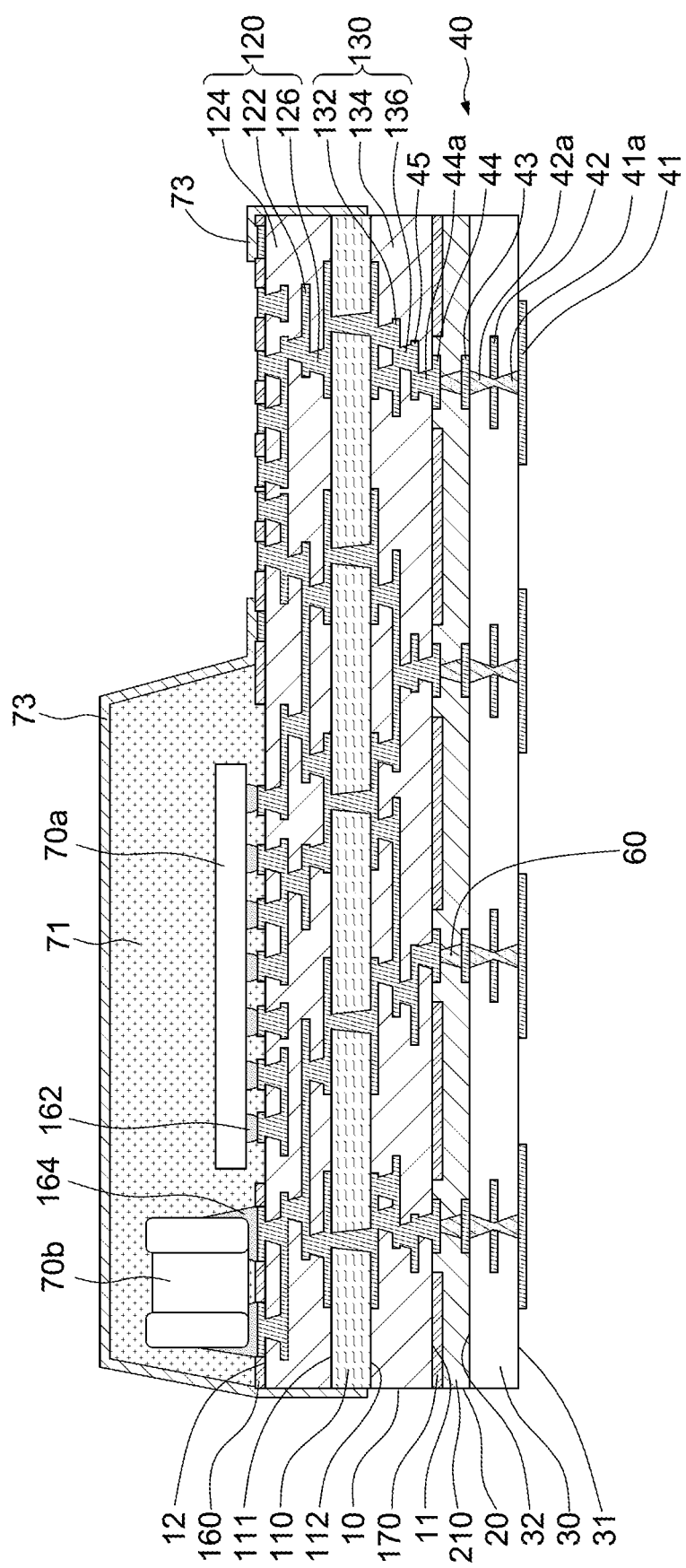

Referring to FIG. 7D, the structure illustrated in FIG. 7C is flipped over, electronic components 70a and 70b are disposed on the surface 12 of the substrate 10, a package body 71 is formed to cover the electronic components 70a and 70b, and a shielding layer 73 is formed on an external surface of the package body 71 and covers the package body 71, electronic components 70a and 70b, and a portion of a lateral surface the substrate 10. In some embodiments, the electronic components 70a and 70b are connected to the circuit layer 120 by flip-chip (FC) bonding through some conductive structures 162 and 164.

Figure 7E:
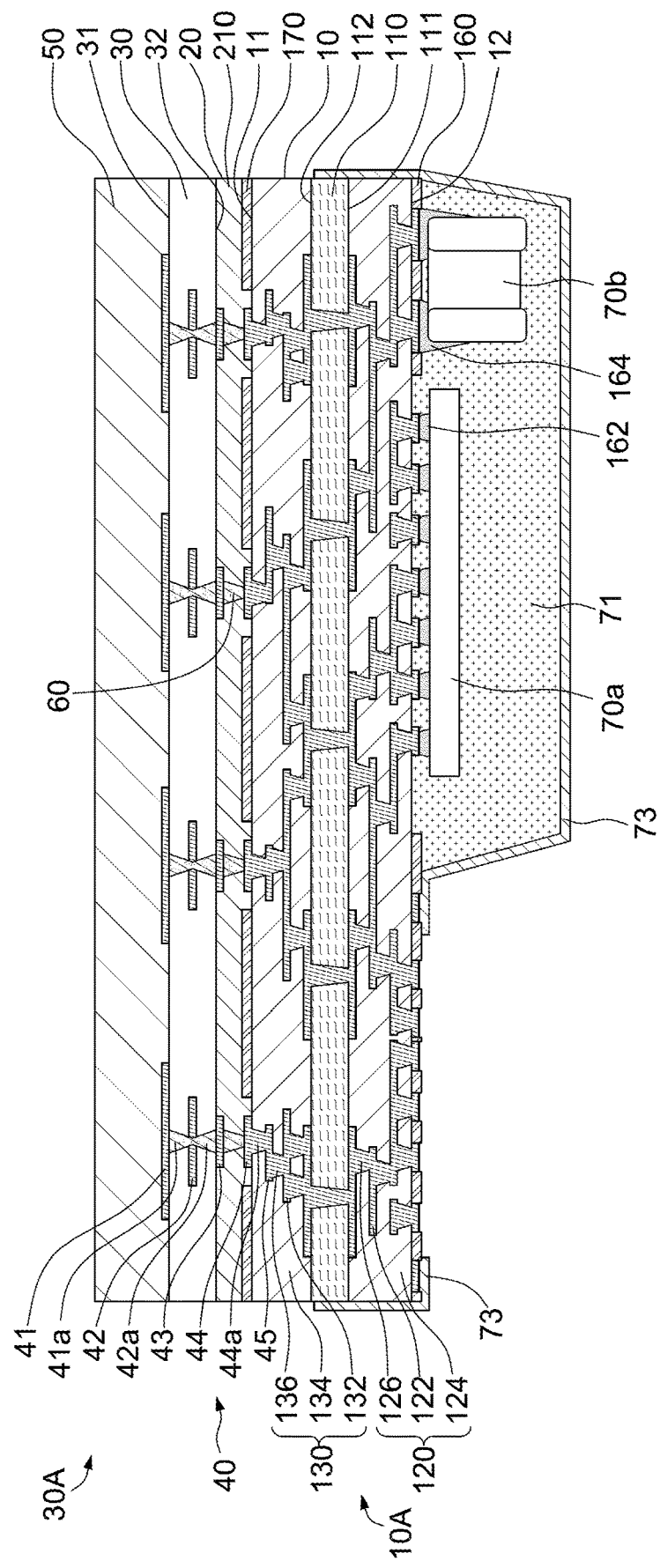

Referring to FIG. 7E, the structure illustrated in FIG. 7D is flipped over, and a protection layer 50 is formed on a surface 31 of the dielectric layer 30 and covers the conductive layer 41. In some embodiments, the protection layer 50 may include a molding compound material. In some embodiments, a device 30A including the dielectric layer 30, an antenna (e.g., conductive layers 41, 42, and 43, but the present disclosure is not limited thereto), and the protection layer 50 is thus provided. In some embodiments, the device 30A is bonded to the device 10A by connecting the dielectric layer 30 to the substrate 10.

Figure 7F:
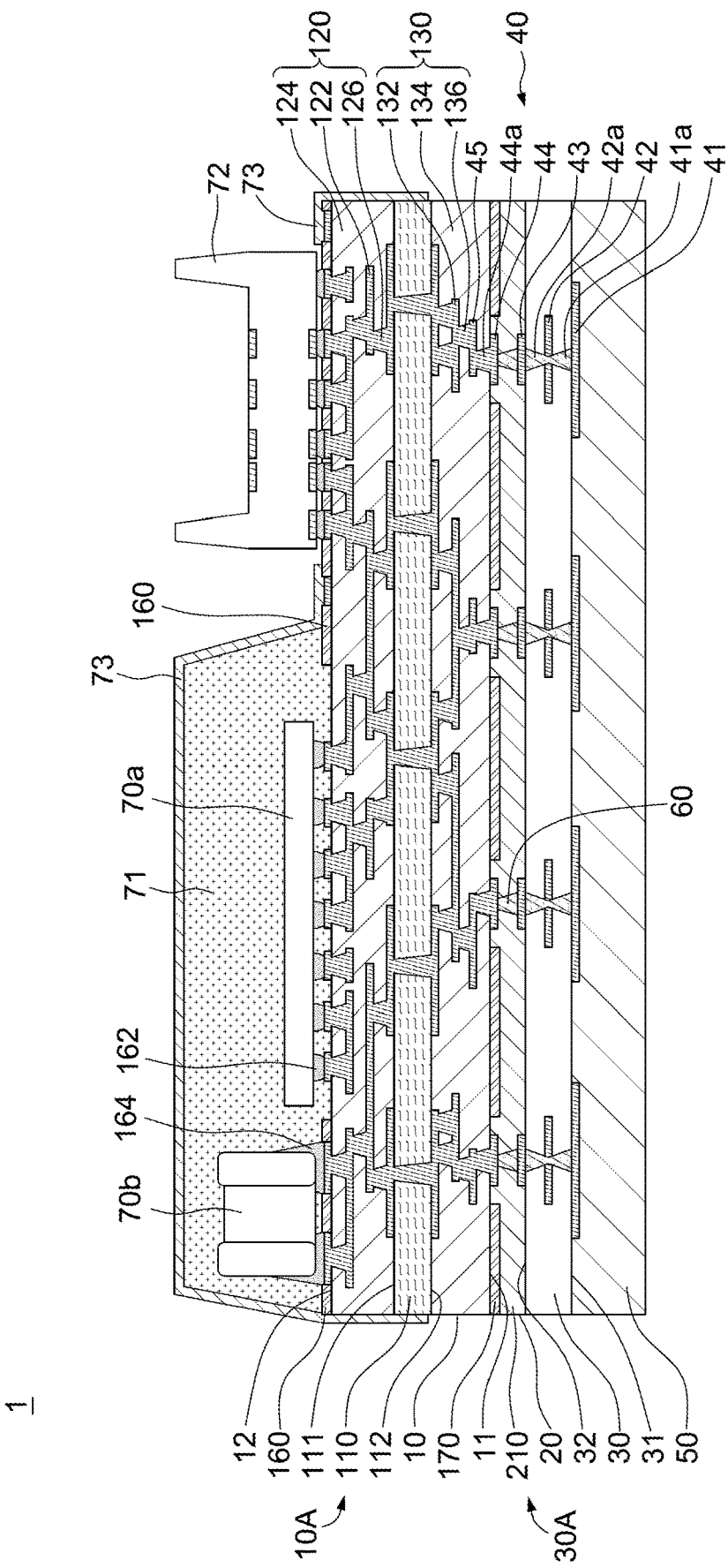

Referring to FIG. 7F, the structure illustrated in FIG. 7E is flipped over, and a connector 72 is disposed on the surface 12 of the substrate 10. The connector 72 may be connected to the substrate 10 by way of flip-chip or wire-bond techniques. As such, the semiconductor device package 1 illustrated in FIG. 1 is formed.

FIG. 8A, FIG. 8B, FIG. 8C, FIG.8D, FIG. 8E, FIG. 8F, and FIG. 8G illustrate one or more stages of a method of manufacturing a semiconductor device package in accordance with some embodiments of the present disclosure.

Referring to FIG. 8A, a strip including a dielectric layer 30 and conductive layers 41, 42 and 43 on or embedded in the dielectric layer 30 is provided, and a protection layer 50 is formed on a surface 31 of the dielectric layer 30 and covers the conductive layer 41.

Referring to FIG. 8B, a singulation operation S1 is performed on the structure illustrated in FIG. 8A to form a plurality of singulated structures 800. In some embodiments, the singulation operation S1 may be performed by cutting through the protection layer 50 and the dielectric layer 30 through a predetermined line to divide the strip structure into the plurality of singulated structures 800. In some embodiments, the device 30A including the dielectric layer 30, an antenna (e.g., conductive layers 41, 42, and 43, but the present disclosure is not limited thereto), and a protection layer 50 is thus provided. In some embodiments, by forming the protection layer 50 on the dielectric layer 30 prior to the singulation operation S1, the rigidity of the composite strip structure including the dielectric layer 30 and the protection layer 50 can be increased, and thus warpage during the singulation operation S1 can be prevented. Therefore, the improved structural strength of the singulated structures 800 is advantageous to performing the subsequent bonding operation.

Figure 8C:
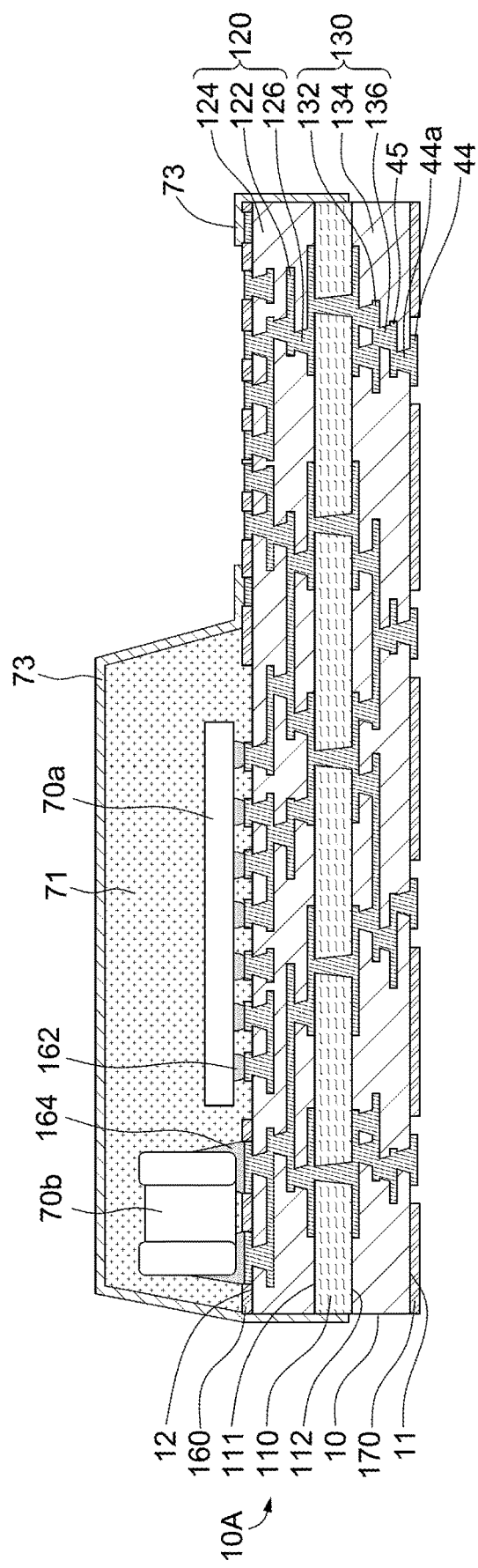

Referring to FIG. 8C, a substrate 10 including a core layer 110 and circuit layers 120 and 130 on two opposite surfaces 111 and 112 of the core layer 110 is provided, electronic components 70a and 70b are disposed on a surface 12 of the substrate 10, a package body 71 is formed to cover the electronic components 70a and 70b, and a shielding layer 73 is formed on an external surface of the package body 71 and covers the package body 71, electronic components 70a and 70b, and a portion of a lateral surface the substrate 10.

Figure 8D:
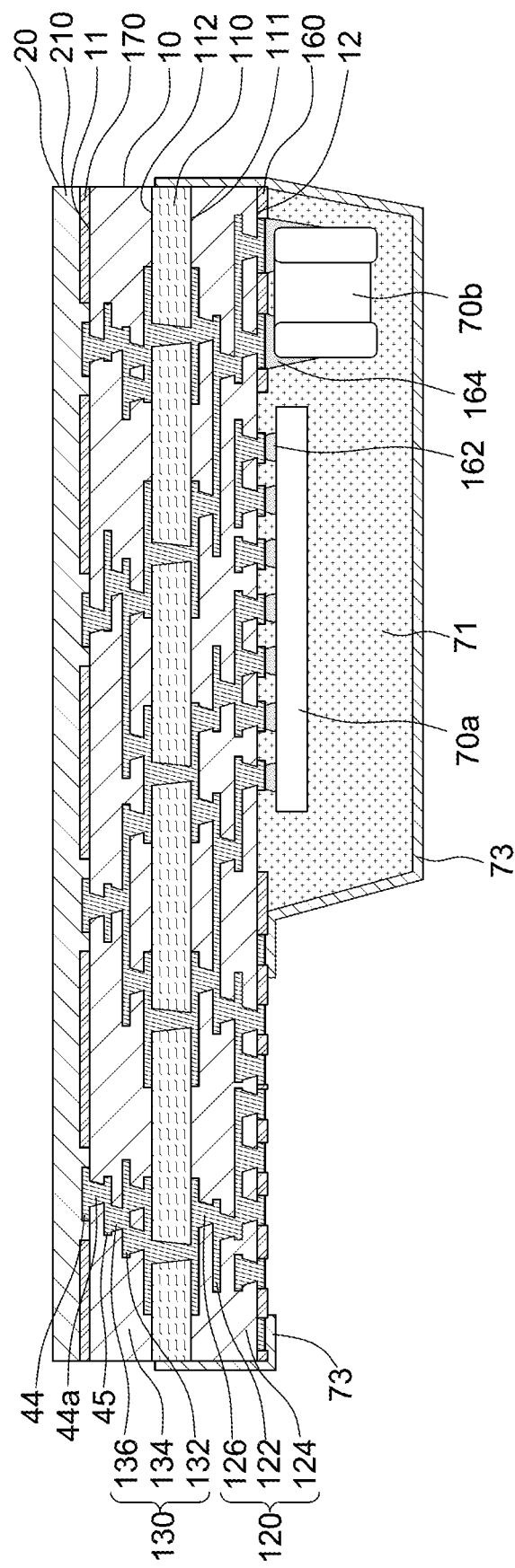

Referring to FIG. 8D, the structure illustrated in FIG. 8C is flipped over, and a connection element 20 is formed on a surface 11 of the substrate 10 and covers the conductive layer 44.

Figure 8E:
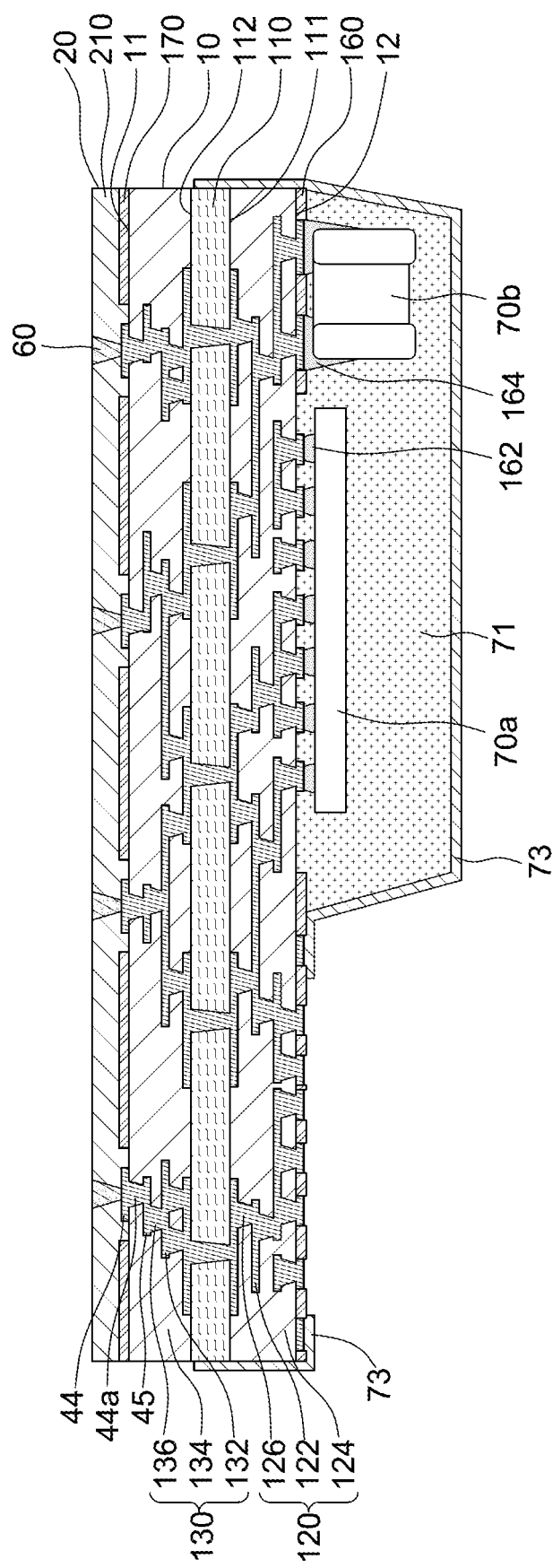

Referring to FIG. 8E, openings are formed within the connection element 20 to expose portions of the substrate 10, and conductive elements 60 are formed in the openings on the conductive pads (e.g., the conductive layers 44).

Figure 8F:
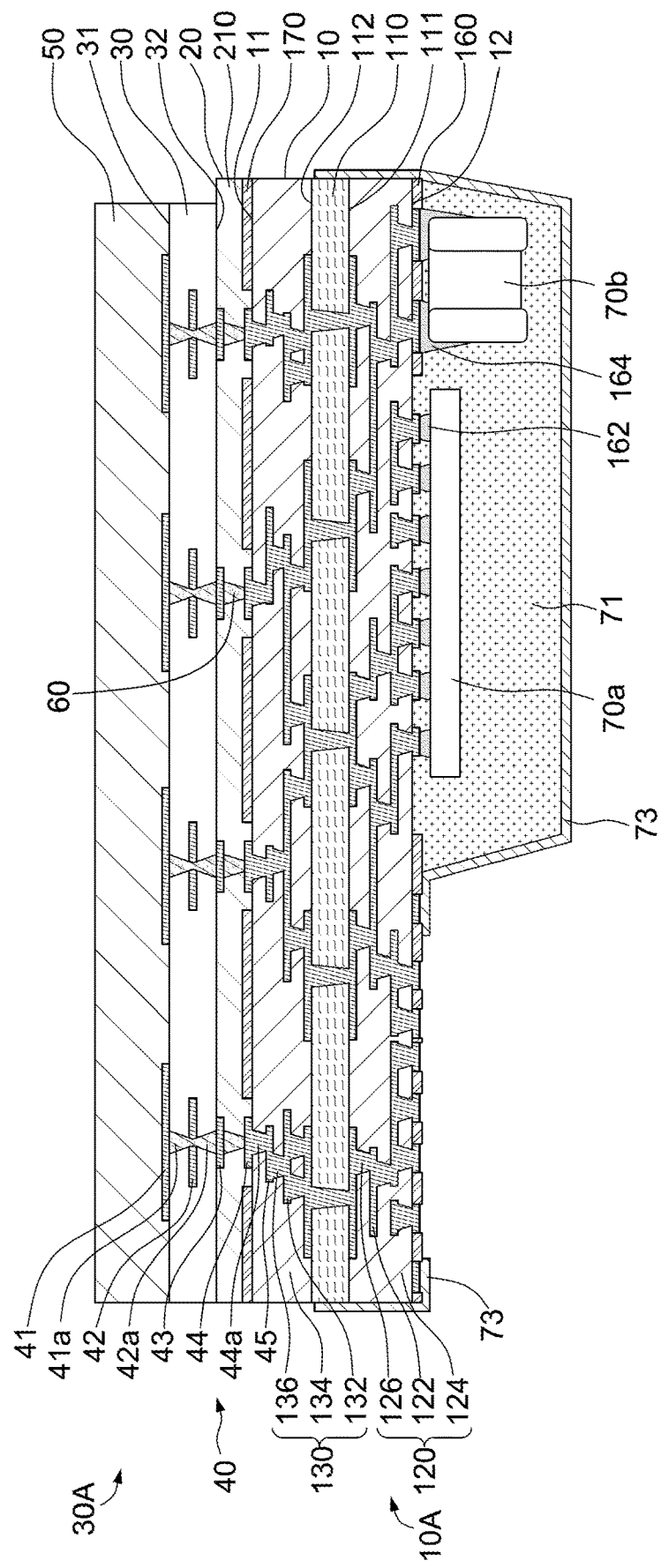

Referring to FIG. 8F, the singulated structure 800 is disposed on the connection element 20. In some embodiments, the singulated structure 800 may be connected to the substrate 10 by flip-chip (FC) bonding through the conductive elements 60 within the connection element 20. In some embodiments, an area of the dielectric layer 30 of the singulated structure 800 may be less than an area of the substrate 10. In some embodiments, the device 30A is bonded to the device 10A by connecting the dielectric layer 30 to the substrate 10. According to some embodiments, by bonding the singulated structure 800 to the substrate 10 which is a strip or wafer, such unit-to-strip bonding can be provided with an improved alignment accuracy, which is advantageous to increasing the yield.

Figure 8G:
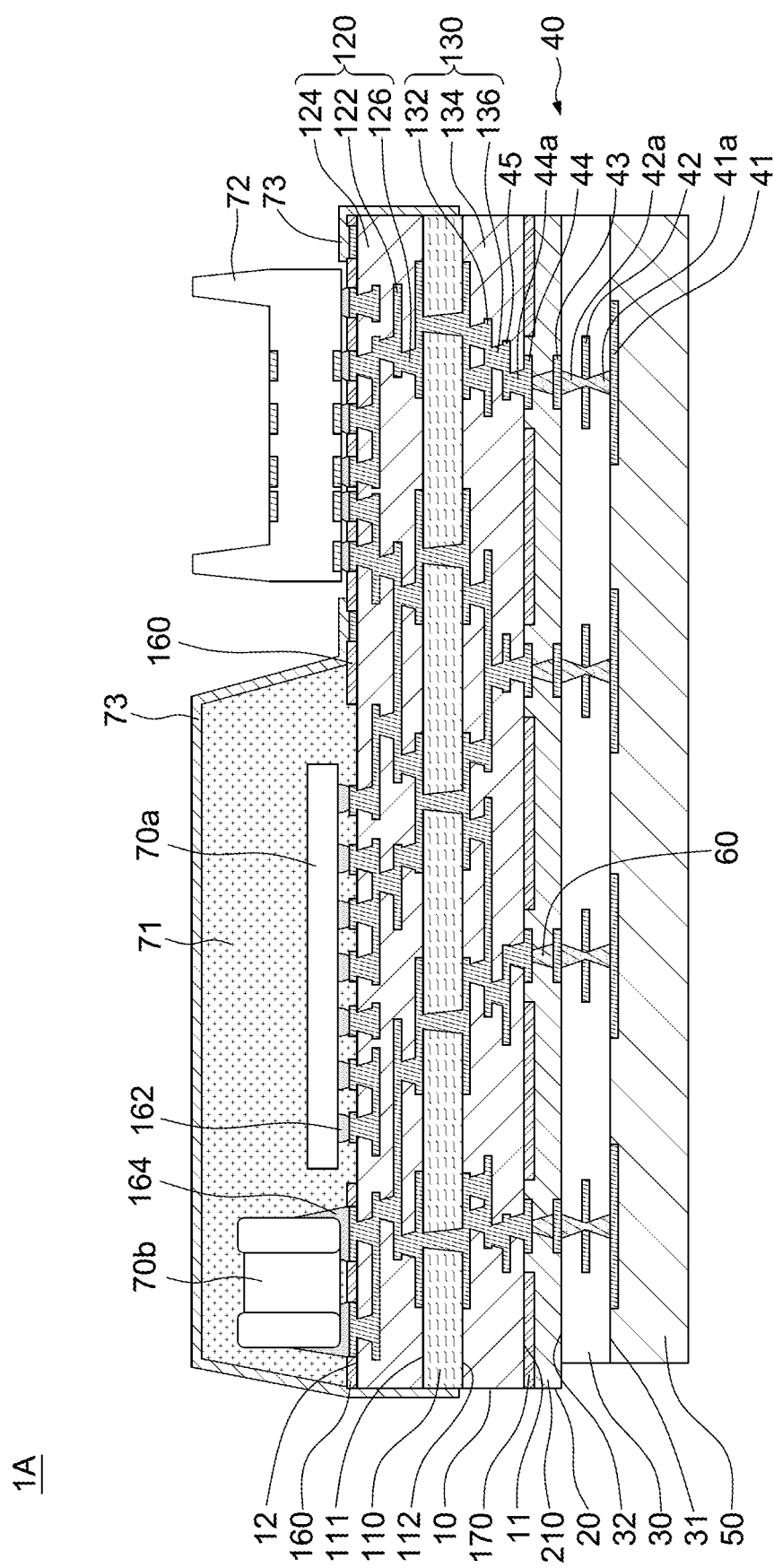

Referring to FIG. 8G, the structure illustrated in FIG. 8F is flipped over, and a connector 72 is disposed on the surface 12 of the substrate 10. The connector 72 may be connected to the substrate 10 by way of flip-chip or wire-bond techniques. As such, a semiconductor device package 1A is formed.

Figure 9A:
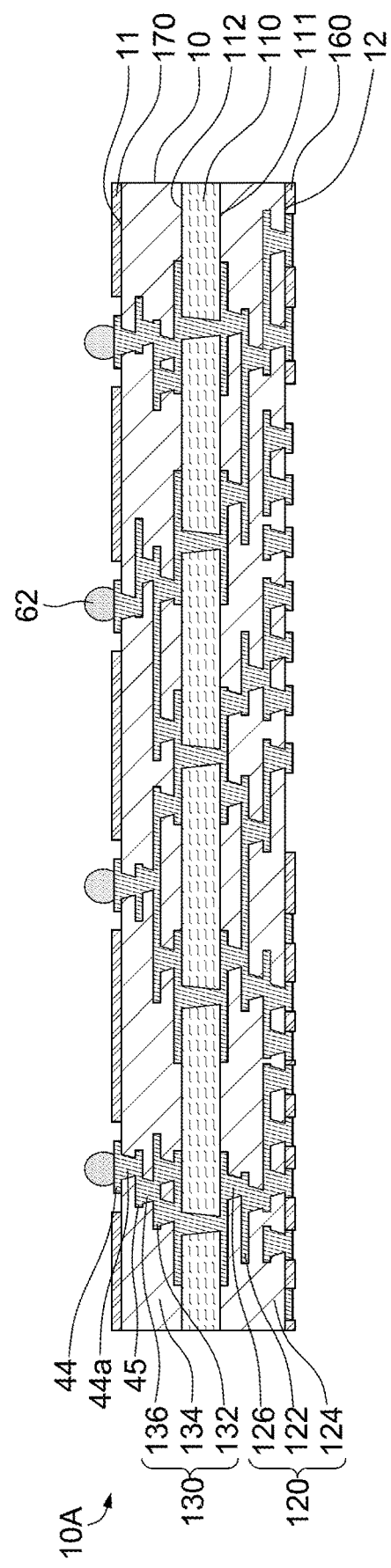
FIG. 9A, FIG. 9B, and FIG. 9C illustrate one or more stages of a method of manufacturing a semiconductor device package in accordance with some embodiments of the present disclosure.
Figure 9B:
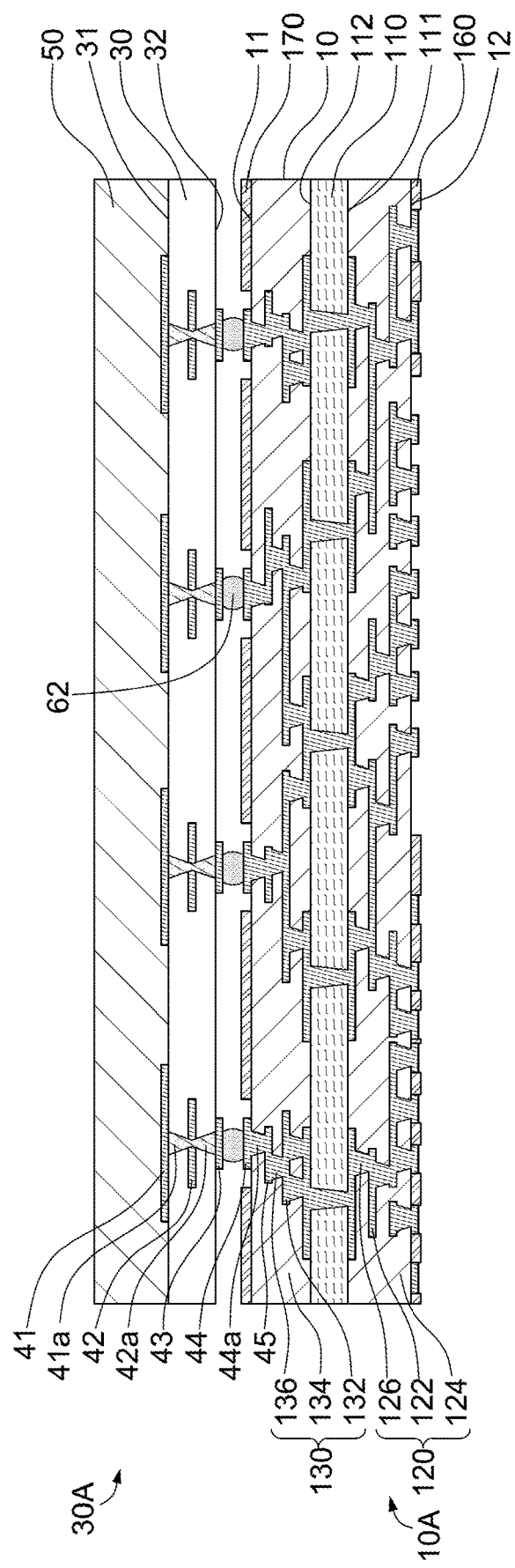
Figure 9C:
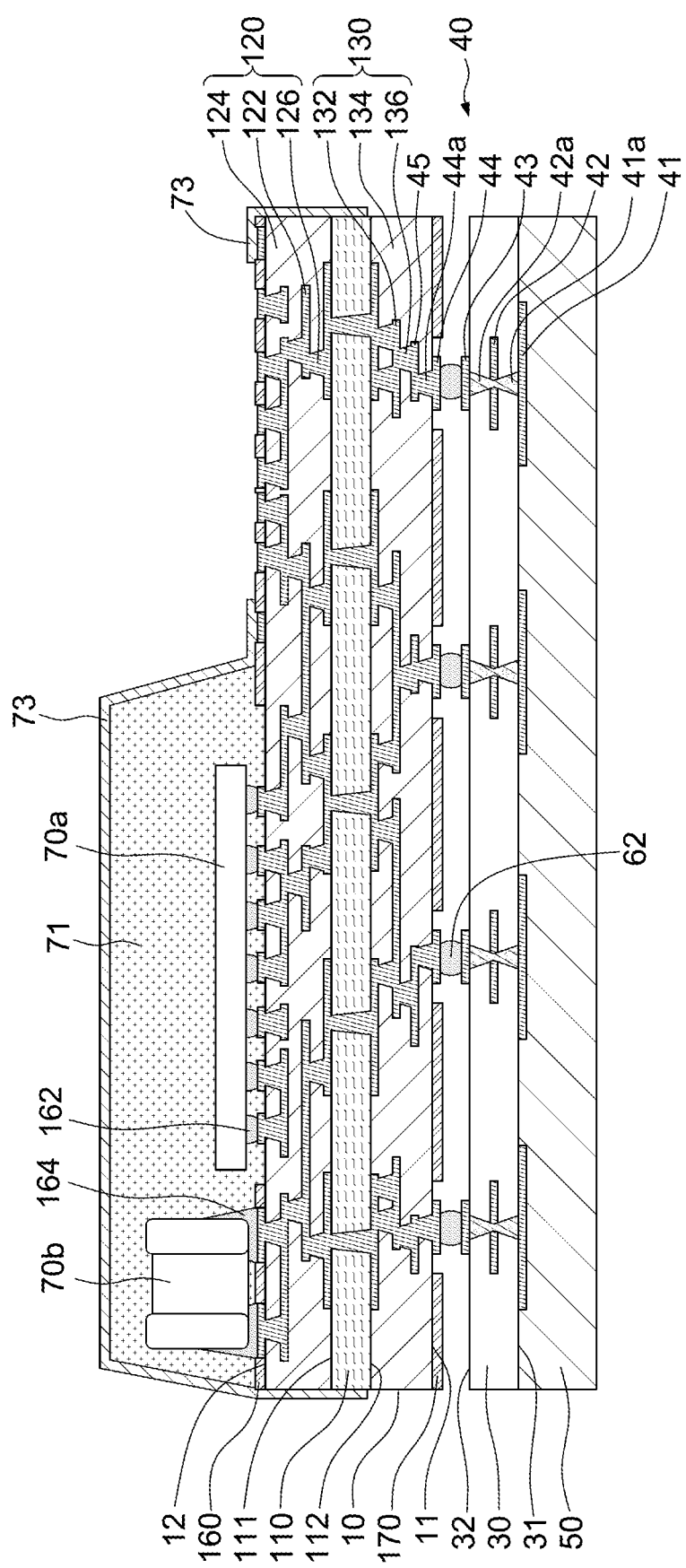

FIG. 9A, FIG. 9B, and FIG. 9C illustrate one or more stages of a method of manufacturing a semiconductor device package 3 in accordance with some embodiments of the present disclosure.

Referring to FIG. 9A, a substrate 10 including a core layer 110 and circuit layers 120 and 130 on two opposite surfaces 111 and 112 of the core layer 110 is provided, an insulating layer 170 is formed on a surface 11 of the substrate 10, and conductive balls 62 are formed on portions of the surface 11 exposed from the insulating layer 170. In some embodiments, the conductive balls 62 are formed on the conductive pads (e.g., the conductive layers 44) on or exposed from the surface 11 of the substrate 10.

Referring to FIG. 9B, a strip including a dielectric layer 30 and conductive layers 41, 42 and 43 on or embedded in the dielectric layer 30 is bonded to the conductive balls 62, and a protection layer 50 is formed on the dielectric layer 30. In some embodiments, the protection layer 50 may be formed on the dielectric layer 30 prior to bonding the dielectric layer 30 to the conductive balls 62.

Referring to FIG. 9C, the structure illustrated in FIG. 9B is flipped over, electronic components 70a and 70b are disposed on a surface 12 of the substrate 10, a package body 71 is formed to cover the electronic components 70a and 70b, and a shielding layer 73 is formed on an external surface of the package body 71 and covers the package body 71, electronic components 70a and 70b, and a portion of a lateral surface the substrate 10.

Next, referring to FIG. 2, a connector 72 is disposed on the surface 12 of the substrate 10. As such, the semiconductor device package 3 illustrated in FIG. 3 is formed.

FIG. 10A, FIG. 10B, FIG. 10C, and FIG. 10D illustrate one or more stages of a method of manufacturing a semiconductor device package in accordance with some embodiments of the present disclosure.

Figure 10A:
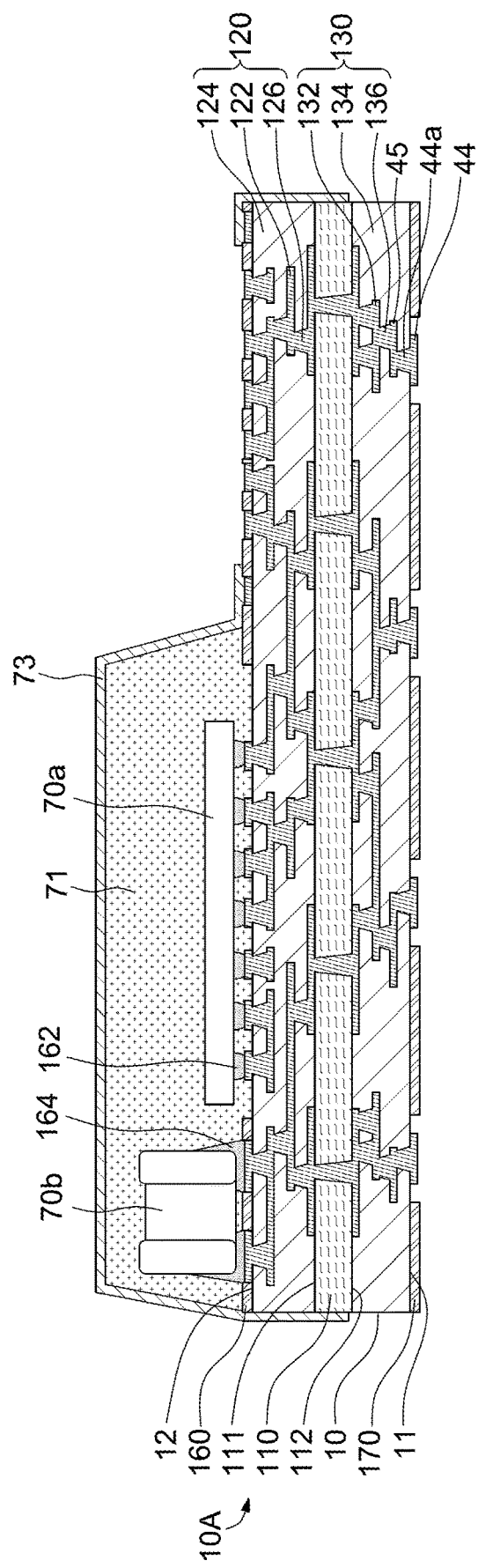
FIG. 10A, FIG. 10B, FIG. 10C, and FIG. 10D illustrate one or more stages of a method of manufacturing a semiconductor device package in accordance with some embodiments of the present disclosure.

Referring to FIG. 10A, operations similar to those illustrated in FIG. 8C are performed.

Figure 10B:
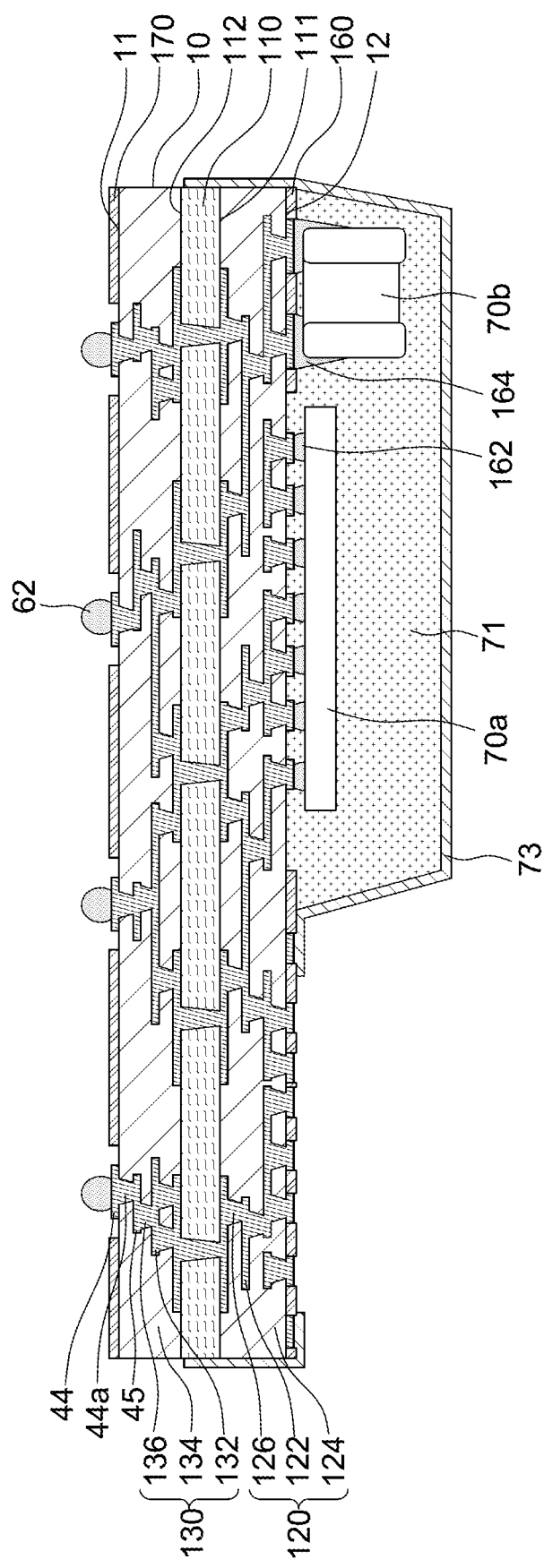

Referring to FIG. 10B, the structure illustrated in FIG. 10A is flipped over, and conductive balls 62 are formed on portions of the surface 11 exposed from the insulating layer 170. In some embodiments, the conductive balls 62 are formed on the conductive pads (e.g., the conductive layers 44) on or exposed from the surface 11 of the substrate 10.

Figure 10C:
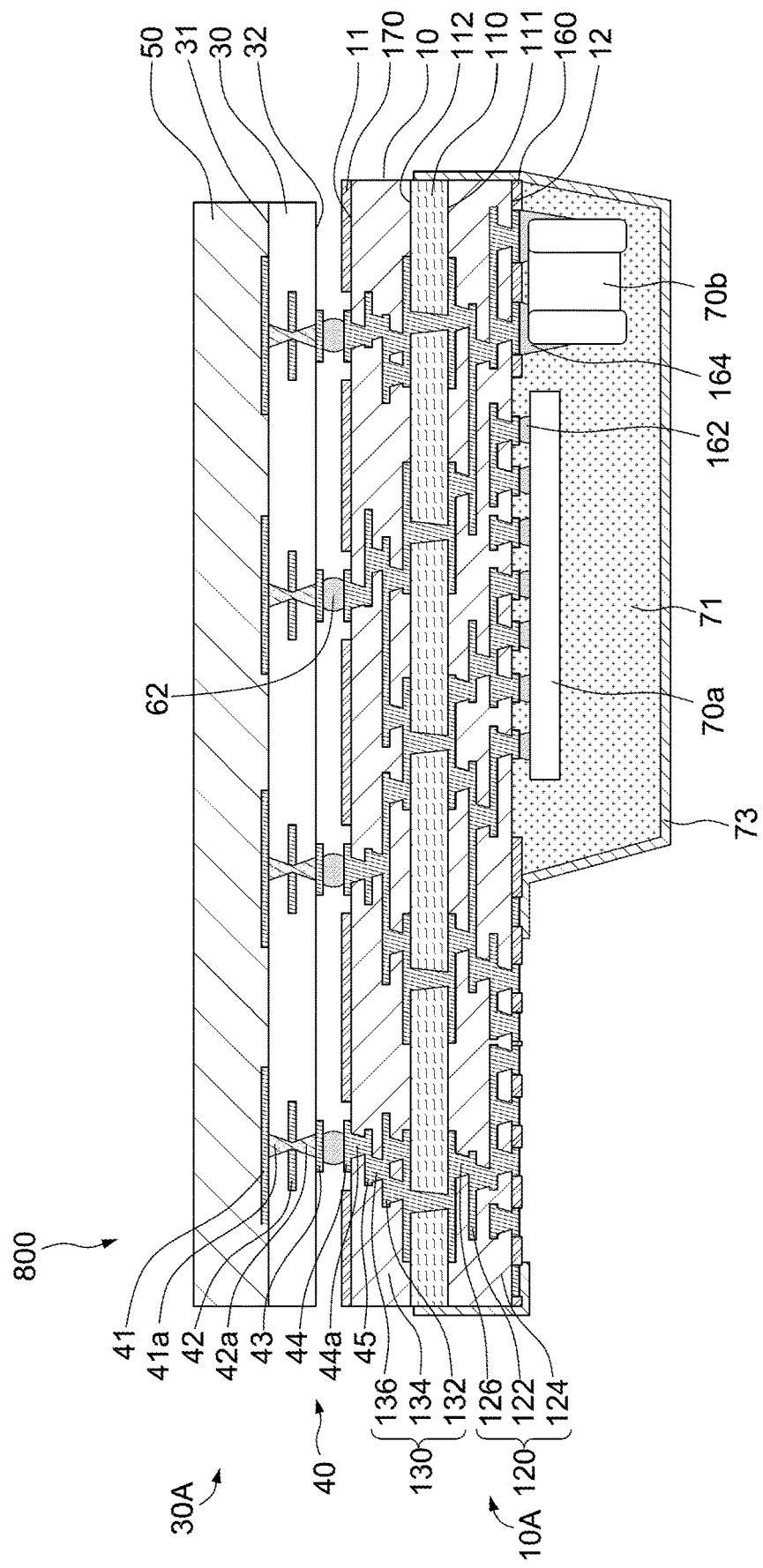

Referring to FIG. 10C, a singulated structure 800 is bonded to the conductive balls 62. In some embodiments, an area of the dielectric layer 30 of the singulated structure 800 may be less than an area of the substrate 10. In some embodiments, the singulated structure 800 may be formed by operations similar to those illustrated in FIGS. 8A-8B.

Figure 10D:
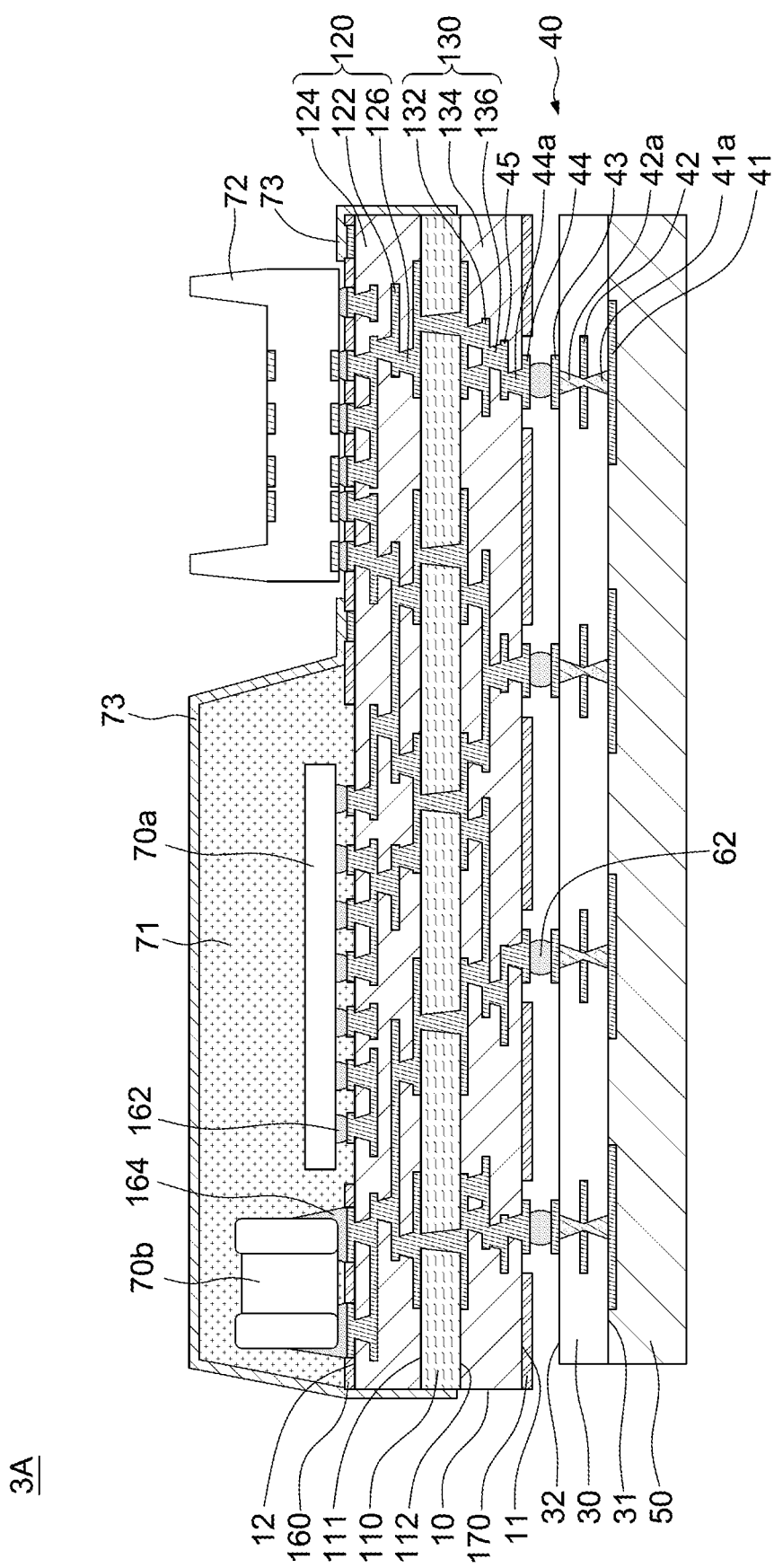

Referring to FIG. 10D, a connector 72 is disposed on the surface 12 of the substrate 10. The connector 72 may be connected to the substrate 10 by way of flip-chip or wire-bond techniques. As such, a semiconductor device package 3A is formed.

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints unless specified otherwise. The term "substantially coplanar" can refer to two surfaces within micrometers (µm) of lying along the same plane, such as within 10 µm, within 5 µm, within 1 µm, or within 0.5 µm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device structure comprising:
a circuit structure; and
an antenna structure electrically connected to the circuit structure and comprising:
a dielectric element having a first dielectric constant; and
a protection layer covering the dielectric element and having a second dielectric constant greater than the first dielectric constant.

2. The semiconductor device structure as claimed in claim 1, further comprising a spacer spacing the circuit structure apart from the antenna structure and electrically connecting the circuit structure to the antenna structure.

3. The semiconductor device structure as claimed in claim 2, wherein the spacer defines an air space between the circuit structure and the antenna structure.

4. The semiconductor device structure as claimed in claim 1, wherein the circuit structure comprises a dielectric layer having a third dielectric constant, and the first dielectric constant is higher than the third dielectric constant.

5. The semiconductor device structure as claimed in claim 1, further comprising an electronic component disposed over the circuit structure and electrically connected to the antenna structure.

6. The semiconductor device structure as claimed in claim 5, further comprising an encapsulant covering the electronic component and exposing a portion of the circuit structure.

7. The semiconductor device structure as claimed in claim 6, further comprising a shielding layer disposed on a surface of the encapsulant, a peripheral region of the circuit structure, and at least a part of the portion of the circuit structure.

8. The semiconductor device structure as claimed in claim 6, further comprising a connector disposed on the portion of the circuit structure.

9. A semiconductor device structure comprising:
a circuit structure; and
an antenna structure supported by the circuit structure and comprising:
a dielectric element having a first modulus; and
a reinforcing element covering the dielectric element and having a second modulus greater than the first modulus.

10. The semiconductor device structure as claimed in claim 9, wherein the antenna structure further comprises an antenna pattern at least partially within the dielectric element.

11. The semiconductor device structure as claimed in claim 10, further comprising a conductive element disposed between the circuit structure and the antenna structure and supporting the antenna structure.

12. The semiconductor device structure as claimed in claim 11, further comprising an electronic component disposed over the circuit structure and electrically connected to the antenna pattern through the conductive element.

13. The semiconductor device structure as claimed in claim 9, wherein the antenna structure further comprises a plurality of antenna patterns free from overlapping each other in a direction substantially perpendicular to a bottom surface of the reinforcing element.

14. A semiconductor device structure comprising:
a circuit structure; and
an antenna structure spaced apart from the circuit structure by a spacer and comprising:
a first antenna pattern; and
a protection layer disposed between the first antenna pattern and the circuit structure and configured to increase a bandwidth of an electromagnetic wave radiated by the first antenna pattern,
wherein the antenna structure further comprises a dielectric layer, and a coefficient of thermal expansion (CTE) of the protection layer is lower than a CTE of the dielectric layer.

15. The semiconductor device structure as claimed in claim 14, wherein the spacer overlaps the first antenna pattern.

16. The semiconductor device structure as claimed in claim 14, wherein the antenna structure further comprises a second antenna pattern overlapping the first antenna pattern, the first antenna pattern is configured to function as a director, and the second antenna pattern is configured to function as a radiator.

17. The semiconductor device structure as claimed in claim 14, wherein the first antenna pattern is configured to radiate the electromagnetic wave passing the protection layer.

18. The semiconductor device structure as claimed in claim 14, wherein a width of the antenna structure is different from a width of the circuit structure.

19. The semiconductor device structure as claimed in claim 18, wherein a first lateral side of the circuit structure and a second lateral side of the antenna structure are at a same side with respect to the first antenna pattern, and the first lateral side is misaligned with the second lateral side.

* * * * *